(12) United States Patent
Sasaki et al.

(10) Patent No.: US 10,304,863 B2
(45) Date of Patent: May 28, 2019

(54) SEMICONDUCTOR DEVICE AND DISPLAY DEVICE

(71) Applicant: Japan Display Inc., Tokyo (JP)

(72) Inventors: Toshinari Sasaki, Tokyo (JP); Shinichiro Oka, Tokyo (JP); Takuma Nishinohara, Tokyo (JP)

(73) Assignee: Japan Display Inc., Tokyo (JP)

( * ) Notice: Subject to any disclaimer, the term of this patent is extended or adjusted under 35 U.S.C. 154(b) by 52 days.

(21) Appl. No.: 15/698,701

(22) Filed: Sep. 8, 2017

(65) Prior Publication Data

US 2018/0090515 A1    Mar. 29, 2018

(30) Foreign Application Priority Data

Sep. 27, 2016   (JP) ................ 2016-187842

(51) Int. Cl.
| | |
|---|---|
| *H01L 27/12* | (2006.01) |
| *G06F 3/041* | (2006.01) |
| *G06F 3/044* | (2006.01) |
| *G02F 1/1333* | (2006.01) |
| *G02F 1/1339* | (2006.01) |
| *G02F 1/1362* | (2006.01) |
| *G02F 1/1345* | (2006.01) |
| *G02F 1/1368* | (2006.01) |

(52) U.S. Cl.
CPC ......... *H01L 27/124* (2013.01); *G02F 1/1339* (2013.01); *G02F 1/1368* (2013.01); *G02F 1/13338* (2013.01); *G02F 1/13452* (2013.01); *G02F 1/136286* (2013.01); *G06F 3/044* (2013.01); *G06F 3/0412* (2013.01); *H01L 27/1248* (2013.01); *G06F 2203/04102* (2013.01); *G06F 2203/04103* (2013.01)

(58) Field of Classification Search
None
See application file for complete search history.

(56) References Cited

U.S. PATENT DOCUMENTS

| | | | |
|---|---|---|---|
| 2001/0004273 A1* | 6/2001 | Sugimoto | G02F 1/13458 349/43 |
| 2010/0182273 A1 | 7/2010 | Noguchi et al. | |
| 2013/0009150 A1* | 1/2013 | Inoue | H01L 23/49822 257/43 |
| 2013/0256673 A1* | 10/2013 | Nishiyama | H01L 29/78606 257/59 |
| 2016/0155391 A1* | 6/2016 | Takesue | G06F 3/1438 345/690 |

FOREIGN PATENT DOCUMENTS

JP    2009-244958 A    10/2009

* cited by examiner

*Primary Examiner* — Ashok Patel
(74) *Attorney, Agent, or Firm* — TYPHA IP LLC

(57) ABSTRACT

A semiconductor device includes a first resin layer, one or more first wirings above the first resin layer, a second resin layer above the first wiring, the second resin layer including a first opening part, a transistor above the second resin layer, the transistor including a semiconductor layer, a gate insulation layer, and a gate electrode layer; and a second wiring above the second resin layer, the second wiring being connected to the transistor and connected to the first wiring via the first opening part.

10 Claims, 17 Drawing Sheets

SEMICONDUCTOR DEVICE AND DISPLAY DEVICE

CROSS REFERENCE TO RELATED APPLICATIONS

This application is based upon and claims the benefit of priority from the prior Japanese Patent Application No. 2016-187842 filed on Sep. 27, 2016, the entire contents of which are incorporated herein by reference.

FIELD

The present invention is related to a semiconductor device and a display device. In particular, the present invention is related to a structure of wiring in a semiconductor device and a display device.

BACKGROUND

A touch sensor is known as an interface allowing a user to input information to a display device. The touch sensor is set on a screen of the display device, so that the user may operate an input button, an icon or the like displayed on the screen to easily input information to the display device. For example, Japanese Patent Application Publication No. 2009-244958 discloses an electronic device including a touch sensor provided in a Liquid Crystal display device.

In a conventional display device mounted with a touch sensor disclosed in Japanese Patent Laid-Open Patent Publication No. 2009-244958, a touch detection electrode is formed on the side of an opposing glass substrate. The opposing glass substrate is bonded to a transistor array substrate formed with a transistor. However, in a flexible display device in which a resin substrate is used for both the transistor array substrate and the opposing substrate, the opposing glass substrate is peeled off during the manufacturing process. Therefore, the touch detection electrode cannot be formed on the opposing substrate side. Furthermore, apart from a FPC which is connected to a driving circuit for driving a display panel, it was necessary to arrange another FPC connected to a touch detection driving circuit.

SUMMARY

A semiconductor device according to one embodiment of the present invention includes a first resin layer, one or more first wirings above the first resin layer, a second resin layer above the first wiring, the second resin layer including a first opening part, a transistor above the second resin layer, the transistor including a semiconductor layer, a gate insulation layer, and a gate electrode layer; and a second wiring above the second resin layer, the second wiring being connected to the transistor and connected to the first wiring via the first opening part.

A display device according to one embodiment of the present invention includes a first resin layer, a first wiring above the first resin layer, the first wiring detecting an input operation from the exterior, a second resin layer above the first wiring, the second resin layer having a first opening part, a transistor above the second resin layer, the transistor having a semiconductor layer, a gate insulation layer and a gate electrode layer, a second wiring above the second resin layer, the second wiring being connected to the transistor and to the first wiring via first opening part, a light emitting layer above the second resin layer, the light emitting layer being connected to the transistor, and a sealing structured body sealing the light emitting layer.

A display device according to one embodiment of the present invention includes a first resin layer, a first wiring above the first resin layer, the first wiring detecting an input operation from the exterior, a second resin layer above the first wiring, the second resin layer having a first opening part, a transistor above the second resin layer, the transistor having a semiconductor layer, a gate insulation layer and a gate electrode layer, a second wiring above the second resin layer, the second wiring being connected to the transistor and to the first wiring via first opening part, a liquid crystal layer above the second resin layer, and a sealing structured body sealing the liquid crystal layer.

DESCRIPTION OF EMBODIMENTS

Figure 1:
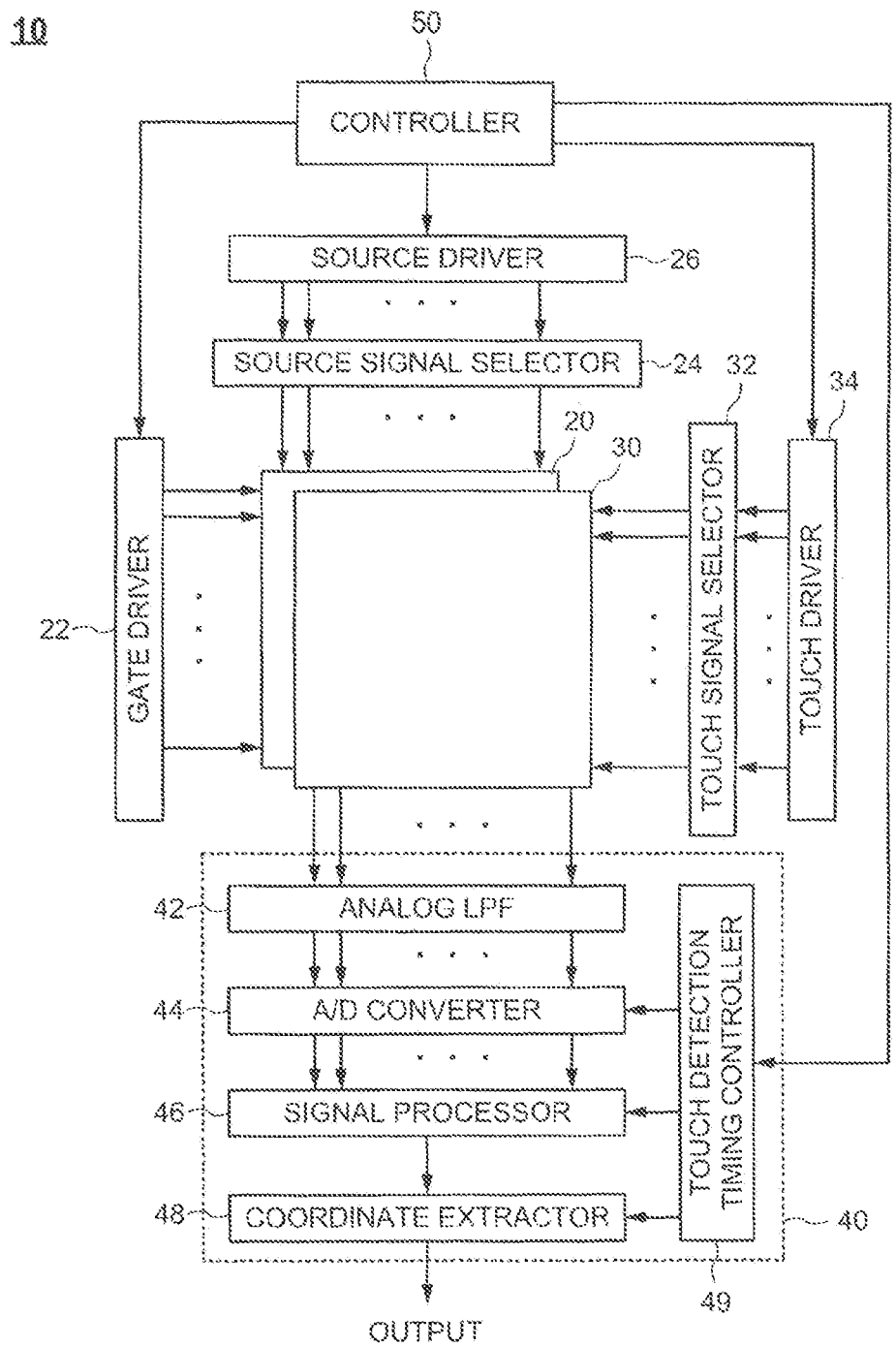
FIG. 1 is a functional block diagram showing an outline of a display device related to one embodiment of the present invention.

Hereinafter, embodiments of the present invention will be described with reference to the drawings. The disclosure merely provides examples, and alternations and modifications easily conceivable by a person of ordinary skill in the art without departing from the gist of the present invention are duly encompassed in the scope of the present invention. In the drawings, components may be shown schematically regarding the width, thickness, shape and the like, instead of being shown in accordance with the actual sizes, for the sake of clear illustration. The drawings merely show examples and do not limit the interpretations of the present invention in any way. In the specification and the drawings, components that are substantially the same as those shown in a previous drawing(s) bear the identical reference signs thereto, and detailed descriptions thereof may be omitted. The following embodiments have an object of providing a display device including a semiconductor device and a display device that has a novel electrode structure.

First Embodiment

An outline of a display device related to one embodiment of the present invention is explained using FIG. 1 to FIG. 11. In the first embodiment, an organic EL display device arranged with a touch sensor is explained. The embodiments shown herein are not limited to the embodiments of the present invention. The embodiments of the present invention can be applied to a semiconductor device. The semiconductor device excludes display devices which include a transistor arranged above a resin substrate having flexibility. For example, the structure described in one embodiment of the present invention can be applied in the case where it is necessary to connect a substrate formed with a transistor layer and wiring to a semiconductor device which is separate from this substrate. The embodiments of the present invention may also be applied to an integrated circuit (IC) such as a micro-processing unit (MPU). The embodiments of the present invention are not limited to an organic EL display device. For example, the embodiments of the present invention may also be applied to liquid crystal devices (LCD), self-light emitting display devices which use elements other than organic EL elements as light emitting elements, or reflecting type display devices such as electronic paper.

[Functional Structure of Display Device 10]

FIG. 1 is a functional block diagram showing an outline of a display device related to one embodiment of the present invention. The display device 10 includes a display part 20, a touch sensor part 30, a touch detection part 40 and a control part 50. The touch detection part 40 is connected to the touch sensor part 30. The touch detection part 40 receives touch detection signals. A touch detection signal is a signal which indicates contact or near contact (contact or near contact is referred to as a "touch" herein) of an object with the touch sensor part 30 output from the touch sensor part 30.

The display part 20 is connected with, and controlled by, a gate driver 22, a source signal selector 24, and a source driver 26. Specifically, the display part 20 includes a plurality of pixel circuits arrayed in a matrix, namely, in a plurality of rows and a plurality of columns. Each of the pixel circuits is controlled by the gate driver 22, the source signal selector 24, and the source driver 26. A single-color pixel provided to realize a full-color display will be referred to as a "sub pixel". A minimum unit of sub pixels that realizes a full-color display or a white display will be referred to as a "main pixel". Hereinafter, a "pixel" refers to a sub-pixel unless otherwise specified.

The gate driver 22 is a driving circuit that selects a row of sub-pixels to which an image signal is to be written. As described below, each pixel circuit includes a plurality of transistors. The gate driver 22 controls the plurality of transistors to be on or off. The gate driver 22 selects the transistors included in the pixel circuits in each row exclusively and sequentially in a predetermined order. The gate driver 22 selects a row of sub-pixels to which an image signal input by the source signal selector 24 and the source driver 26 is to be supplied, and thus supplies an image signal to a driving transistor (one of the plurality of transistors) included in each of the pixel circuits in each row.

The source signal selector 24 selects a column of sub-pixels to which an image signal is to be supplied in accordance with a control signal generated by the source driver 26. The source signal selector 24 includes a multiplexer circuit. The multiplexer circuit performs so-called multiplexer driving, namely, supplies an image signal to each of sub-pixels, for example, a red sub-pixel R, a green sub-pixel G and a blue sub-pixel B, sequentially. The source signal selector 24 includes the multiplexer circuit, so that the number of lines between the source driver 26 and the controller 50 is decreased.

The touch sensing part 30 is connected with, and controlled by, a touch signal selector 32 and a touch driver 34. Specifically, the touch sensing part 30 includes a plurality of touch sensor driving electrodes (corresponding to "first sensor wiring 120" described below). Each of the touch sensor driving electrodes is controlled by the touch signal selector 32 and the touch driver 34.

Each touch sensor driving electrode is commonly provided for a plurality of sub-pixels. In this embodiment, each touch sensor driving electrode is commonly provided for a plurality of sub-pixels arrayed in one row in the row direction (hereinafter, such sub-pixels will be collectively referred to as a "row pixel group"). In this embodiment, two row pixel groups are located in correspondence with one block of touch sensor driving electrode. Alternatively, one row pixel group may be located in correspondence with one block of touch sensor driving electrodes, or three or more row pixel groups may be located in correspondence with one block of touch sensor driving electrodes. In this embodiment, each touch sensor driving electrode is located in correspondence with at least one row pixel group. The present invention is not limited to this structure. For example, each touch sensor driving electrode may be located in correspondence with sub-pixels in i rows by j columns, and such touch sensor driving electrodes may be arrayed in a matrix (i and j are each an arbitrary integer).

As can be seen from the above, each touch sensor driving electrode has a width corresponding to an integral multiple of the size of each sub-pixel in the column direction. Each touch sensor driving electrode extends in the row direction. The number of the touch sensor driving electrodes does not necessarily match the number of the row pixel groups.

The touch driver 34 is a driving circuit that selects a block at which the touch sensor is to be driven. The touch driver 34 selects the plurality of blocks of touch sensor driving electrodes exclusively and sequentially in a predetermined order. The touch signal selector 32 selects a block of touch sensor driving electrodes to which a touch sensor driving signal is to be supplied in accordance with a control signal generated by the touch driver 34. The touch signal selector 32 includes a multiplexer circuit. The multiplexer circuit performs multiplexer driving the same as the source signal selector 24. The touch signal selector 32 includes the multiplexer circuit, so that the number of lines between the touch driver 34 and the controller 50 is decreased.

The touch detector 40 is connected with the touch sensing part 30. The touch detector 40 receives a touch detection signal output from the touch sensing part 30. The touch detection signal indicates a touch of a detected object on or close to the touch sensing part 30. Specifically, the touch sensing part 30 includes a plurality of touch detection electrodes (corresponding to "second sensor wiring 180" described below). The touch detector 40 receives a touch detection signal via each of the touch detection electrodes. The touch detector 40 includes an analog LPF (Low Pass Filter) 42, an A/D (analog/digital) converter 44, a signal processor 46, a coordinate extractor 38, and a touch detection timing controller 49. The detected object may be a finger, a hand or the like of the user using the display device 10, or alternatively, a stylus or the like.

The touch detector 40 detects whether or not there is a touch on the touch sensing part 30 based on a control signal supplied from the controller 50 and a touch detection signal supplied from the touch sensing part 30. When a touch on the touch sensing part 30 is detected, the touch detector 40 calculates a coordinate position at which the touch has been detected. Among the plurality of detection electrodes, every two touch detection electrodes adjacent to each other are separated from each other. Namely, the plurality of touch detection electrodes are electrically independent from each other. The plurality of touch detection electrodes are connected with a plurality of output terminals respectively.

The analog LPF 42 is an analog low pass filter that removes a high frequency component (noise component) included in the touch detection signal received from the touch sensing part 30, and extracts and outputs a touch component based on the touch detection. Although not shown, a resistance element is provided between an input terminal of the analog LPF 42 and the ground GND. The A/D converter 44 is a circuit that samples an analog signal output from the analog LPF 42 in synchronization with the touch sensor driving signal output via the touch signal selector 32 and converts the analog signal into a digital signal.

The signal processor 46 includes a digital filter. The digital filter removes noise of the output signal from the A/D converter 44 and extracts the touch component. Specifically, the signal processor 46 removes a high frequency component that is higher than the frequency of the touch sensor driving signal sampled by the touch signal selector 32. The signal processor 46 is a logic circuit that determines whether or not a touch on the touch sensing part 30 has been detected based on the output signal from the A/D converter 44. The coordinate extractor 48 is a logic circuit that calculates a coordinate position at which the touch has been detected when the signal processor 46 determines that a touch on the touch sensing part 30 has been detected. The coordinate extractor 48 outputs the calculated coordinate position as the output signal. The touch detection timing controller 49 performs control such that the A/D converter 44, the signal processor 46 and the coordinate extractor 48 are operated in synchronization with each other.

[Structure of the Touch Sensor Driving Electrode in the Touch Sensing Part 30]

Figure 2:
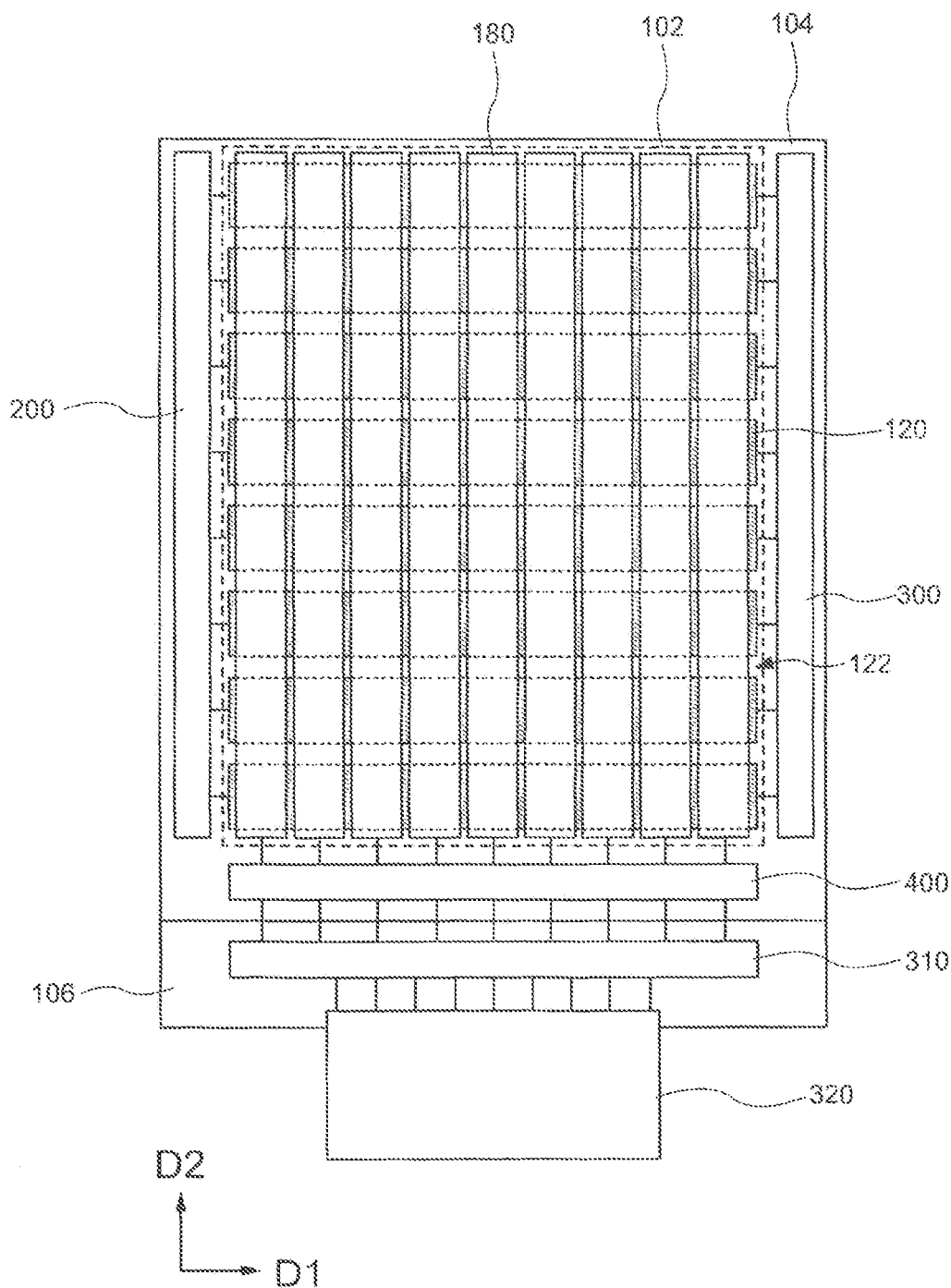
FIG. 2 is an upper surface view showing a positional relationship of a touch detection electrode of a display device related to one embodiment of the present invention.
Figure 3:
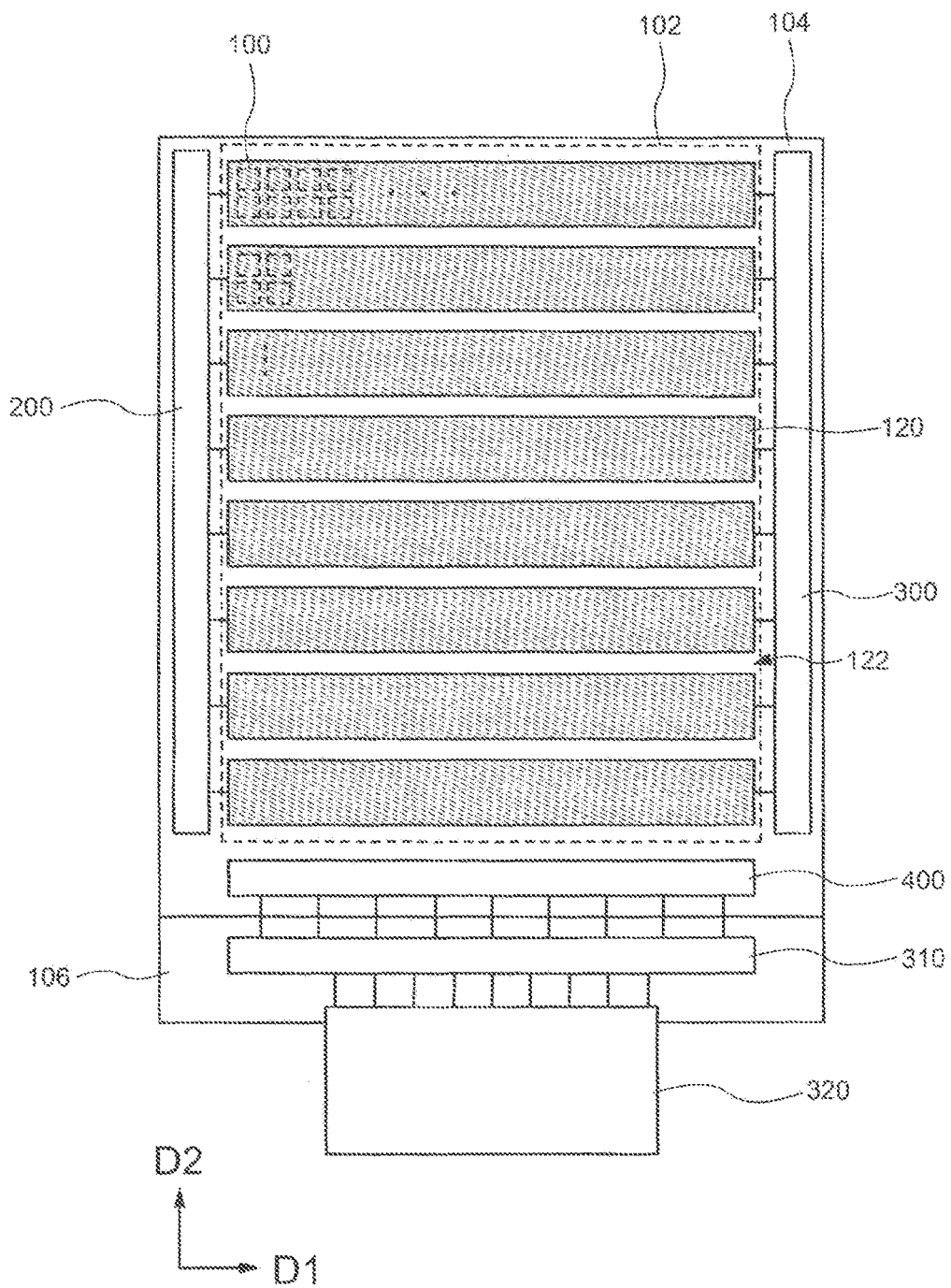
FIG. 3 is an upper surface view showing a positional relationship of a touch detection electrode of a display device related to one embodiment of the present invention.

A structure of the touch sensor driving electrodes (first sensor wiring 120) in the touch sensing part 30 and a structure of the touch detection electrodes (second sensor wiring 180) in the touch detector 40 is explained using FIG. 2 and FIG. 3. FIG. 2 and FIG. 3 are a plan view showing the positional relationship between the touch detecting electrodes in the display device 10 in one embodiment related to the present invention. The display device 10 includes a display region 102, a peripheral region 104, and a terminal region 106. The display region 102 includes the sub-pixels displaying an image. The peripheral region 104 is a region around the display region 102. The terminal region 106 is adjacent to one end of the peripheral region 104.

A plurality of sub-pixels 100 is arranged in a matrix shape in the display region 102. A plurality of first sensor wirings 120 and a plurality of second sensor wirings 180 are arranged corresponding to the plurality of sub-pixels 100. The plurality of first sensor wirings 120 and plurality of second sensor wirings 180 are wiring for detecting an input operation from the exterior. The plurality of first sensor wirings 120 has a long side in a row direction. Each of the plurality of first sensor wirings 120 is arranged in common for row pixels (plurality of sub-pixels 100 arranged aligned in a row direction). Each of the plurality of first sensor wirings 120 is arranged aligned in a column direction. The plurality of second sensor wirings 180 has a long side in a column direction. Each of the plurality of second sensor wirings 180 is commonly arranged for a plurality of sub-pixels 100 arranged aligned in a column direction. Each of the plurality of second sensor wiring 180 is arranged aligned in a row direction. Although an interval between a second row sub-pixel 100 and third row sub-pixel 100 is shown wider than an interval between a first row sub-pixel 100 and second row sub-pixel 100 in FIG. 3 for the convenience of explanation, in actuality both intervals are the same. The plurality of first sensor wirings 120 may have a long side in a column direction and the plurality of second sensor wirings 180 may have a long side in a row direction.

As shown in FIG. 3, the plurality of sub-pixels 100 are covered with the first sensor wiring 120. Specifically, each first sensor wiring 120 is commonly provided for a plurality of sub-pixels 100. More specifically, each first sensor wiring 120 extending in the row direction (first direction D1) of the display region 102 is commonly provided for a plurality of sub-pixels 100 arrayed in the first direction D1 and also for a plurality of sub-pixels 100 arrayed in a second direction D2 intersecting the first direction D1 (e.g., in the column direction). In FIG. 3, each first sensor wiring 120 covers two rows of sub-pixels 100 arrayed in the second direction D2. In other words, each of the plurality of first sensor wirings 120 is commonly provided for a plurality of row pixel groups adjacent to each other in the second direction D2.

Every two first sensor wirings 120 adjacent to each other are separated from each other. In other words, a slit 122 is provided between every two first sensor wirings 120 adjacent to each other in the second direction D2. Such a structure allows the plurality of first sensor wirings 120 to be controlled separately and electrically. In this case, the first sensor wiring 120 may be supplied with the same potential or different potentials at the same time. As shown in FIG. 3, the plurality of blocks of first sensor wirings 120 are sequentially supplied with a touch sensor driving signal. In order to remove noise of a low frequency, it is preferable to supply a touch sensor driving signal to the first sensor wiring 120 at a frequency of 120 Hz or higher.

In the peripheral region 104, a gate driver circuit 200, a touch driver circuit 300, and a touch detection circuit 400 are provided. The gate driver circuit 200 and the touch driver circuit 300 are located in a region adjacent to the display region 102 in the row direction. The touch detection circuit 400 is located in a region adjacent to the display region 102 in the column direction. The gate driver circuit 200 includes a plurality of the gate drivers 22. The touch driver circuit 300 includes the touch signal selector 32 and the touch driver 34. The touch detection circuit 400 includes the analog LPF 42, the A/D converter 44, the signal processor 46, the coordinate extractor 48 and the touch detection timing controller 49.

In the terminal region 106, a COG (Chip On Glass) 310 and an FPC (Flexible Printed Circuit) 320 are provided. The COG 310 includes the source signal selector 24 and the source driver 26. The COG 310 is mounted on a substrate on which the transistors are formed via a bump or the like. The COG 310 is connected with lines provided on the substrate, and supplies a signal and a power supply to various circuits via the lines. The COG 310 may have functions of a part of, or all of, the gate driver circuit 200, the touch driver circuit 300 and the touch detection circuit 400. The FPC 320 is connected with the COG 310. The FPC 320 is connected with an external device. In the example shown in FIG. 2, all the lines extending from the FPC 320 are connected with the COG 310. The present invention is not limited to this structure, and a part of the lines extending from the FPC 320 may be directly connected with the gate driver circuit 200, the touch driver circuit 300 and the touch detection circuit 400.

An image signal supplied from the external device is input to the COG 310 via the FPC 320. The COG 310 drives the gate driver circuit 200, the touch driver circuit 300 and the touch detection circuit 400. As a result of these circuits being driven, the image signal (or gray scale signal) is supplied to the sub-pixels 100 located in the display region 102, and an image based on the image signal is displayed on the display region 102. In FIG. 2 and FIG. 3, the gate driver circuit 200 and the touch driver circuit 300 are located in two different sides having the display region 102 therebetween. Alternatively, the gate driver circuit 200 and the touch driver circuit 300 may be located in a region along one side of the display device 102.

The plurality of sub-pixels 100 may respectively include display elements such as light emitting elements, liquid crystal elements or the like displaying different colors. With such an arrangement, a full-color display is provided. For example, display elements displaying red, green, blue and white may be respectively provided in four sub-pixels 100. Alternatively, display elements displaying red, green and blue may be respectively provided in three sub-pixels 100. The display elements display such colors themselves. Alternatively, the display elements may act as white light sources and provide light of such colors via color filters provided thereon. There is no limitation to the pattern of arrangement of the sub-pixels 100, and the sub-pixels 100 may be arranged in a stripe pattern, a delta pattern, a pentile pattern or the like.

[Cross-Sectional Structure of Display Device 10]

Figure 4:
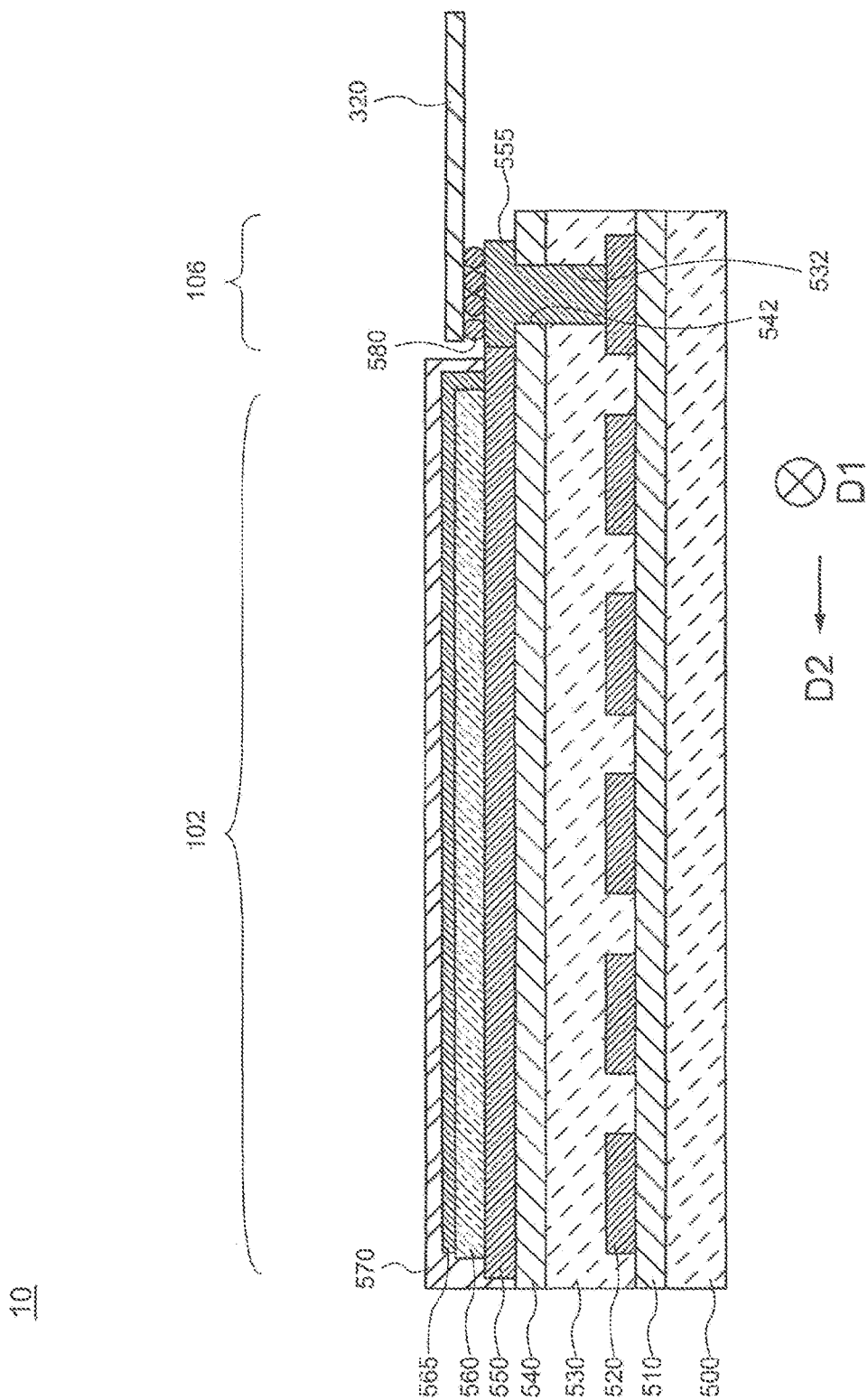
FIG. 4 is a cross-sectional diagram showing an outline of a display device related to one embodiment of the present invention.

FIG. 4 is a cross-sectional diagram showing an outline of a display device related to one embodiment of the present invention. As is shown in FIG. 4, the display device 10 includes a first resin layer 500, a first barrier layer 510, a first wiring 520, a second resin layer 530, a second barrier layer 540, a transistor layer 550, a second wiring 555, a light emitting layer 560, a common electrode 565, a sealing structured body 570 and a FPC 320. The FPC 320 is connected to the second wiring 555 via a bump 580.

The first barrier layer 510 is arranged above the first resin layer 500. The first barrier layer 510 is arranged on the entire surface of the first resin layer 500. The first wiring 520 is arranged above the first barrier layer 510. In the present embodiment, the first wiring 520 includes first sensor wiring 120 having a long side in a direction D1 as shown in FIG. 2 and FIG. 3. That is, the first sensor wiring 120 is formed in the same layer as the first wiring 520. The first sensor wiring 120 is wiring for detecting an exterior input operation. The first wiring 520 is patterned into a shape according to a desired purpose.

In the present embodiment, the first sensor wiring 120 included in the first wiring 520 is touch sensor wiring for detecting the touch of an object. The first sensor wiring 120 may also be a digitizer coil. That is, the first sensor wiring 120 may be an antenna for receiving electromagnetic waves from a pen type input device called a stylus. In addition to that described above, the first sensor wiring 120 may also be pressure sensor wiring. Although a structure was exemplified above in which the first wiring 520 is the first sensor wiring 120, the first wiring 520 may also be wiring other than sensor wiring. For example, the first wiring 520 may also be an antenna which generates power using received electromagnetic waves.

The second resin layer 530 is arranged above the first wiring 520. The second resin layer 530 covers a pattern of the first wiring 520. The second resin layer 530 relieves a step formed by the first wiring 520. Preferably, the second resin layer 530 flattens a step formed by the first wiring 520 and provides a level surface in the top surface of the second resin layer 530. The film thickness of the second resin layer 530 is preferred to be thicker than the film thickness of the first wiring 520. For example, the film thickness of the second resin layer 530 is a thickness of the second resin layer 530 in a region where the first wiring 520 is not formed. A via hole 532 (or opening part) which reaches a part of the first wiring 520 is arranged in the second resin layer 530. A second barrier layer 540 is arranged above the second resin layer 530. The second barrier layer 540 is arranged on the entire surface of the second resin layer 530. A via hole 542 (or opening part) is arranged at the same position as the via hole 532 of the second resin layer 530 in the second barrier layer 540.

A transistor layer 550 is arranged above the second barrier layer 540. The transistor layer 550 includes a transistor, an electrode connected to the transistor and the same layer (electrode layer) of the electrode. The transistor includes a semiconductor layer, a gate insulation layer and a gate electrode layer. The electrode connected to the transistor is a gate electrode, source and drain electrode or a pixel electrode for example. In the following explanation, a conductive layer in the same layer as a gate electrode is referred to as a gate electrode layer and a conductive layer in the same layer as a pixel electrode is referred to as a pixel electrode layer for example. A pixel electrode includes a separate independent pattern according to each pixel.

The second wiring 555 is arranged above the second barrier layer 540 in a terminal region 106 in FIG. 2 and FIG. 3. The second wiring 555 is connected to the first wiring 520 via the via holes 532 and 542. The second wiring 555 includes the same layer as the electrode layer included in the transistor layer 550. For example, the second wiring 555 may be formed by three conductive layers, a gate electrode layer, a source and drain electrode layer and a pixel electrode layer. The second wiring layer 555 is electrically connected with the transistor layer 550.

The light emitting layer 560 is arranged above the second barrier layer 540 the same as the transistor layer 550. The light emitting layer 560 is in contact with each pixel electrode above each pixel electrode of the transistor layer 550. The light emitting layer 560 generates light by a current flowing to the light emitting layer 560. The current flowing to the light emitting layer 560 is based on a potential difference between a pixel electrode and the common electrode 565. The generated light is radiated to the exterior. Apart from a light generating layer which generates light, the light emitting layer 560 may also include an electron transport layer which transports electrons, an electron injection layer which injects electrons into the light generating layer, a hole transport layer which transports holes, and a hole injection layer which injects holes into the light generating layer.

The common electrode 565 is arranged above the light emitting layer 560. The common electrode 565 is in contact with the light emitting layer 560. The common electrode 565 is connected to the transistor layer 550 in a periphery region of the light emitting layer 560. The common electrode 565 is connected to the second wiring 555 via the transistor layer 550. In the present embodiment, the common electrode 565 includes a second sensor wiring 180. As is shown in FIG. 2, the send sensor wiring 180 has a long side in a direction D2. That is, the second sensor wiring 180 is formed in the same layer as the common electrode 565. The second sensor wiring 180 supplies a current to the light emitting layer 560. An input operation from the exterior is detected when a capacitance is formed between the first sensor wiring 120 and the second sensor wiring 180. As is shown in FIG. 2, the second sensor wiring 180 is continuous in the direction D2. A slit is arranged between adjacent second sensor wirings 180 in the direction D1.

Although a structure is shown in the present embodiment in which the second sensor wiring 180 is formed in the same layer as the common electrode 565, the present invention is not limited to this structure. The second sensor wiring 180 may also be formed in the same layer as a conductive layer included in the transistor layer 550 for example. For example, the second sensor wiring 180 may also be formed by at least any one layer of a gate electrode, a source and drain electrode and a pixel electrode.

The sealing structured body 570 seals the light emitting layer 560. Specifically, the sealing structured body 570 covers an organic layer among the light emitting layers 560. The light emitting layers 560 generate light. The sealing structured body 570 suppresses degradation of the light emitting layer 560 due to water and oxygen from the exterior. The sealing structured body 570 exposes a part of at least the second wiring 555 in the terminal region 106. The sealing structured body 570 may also include a plurality of materials. For example, the sealing structured body 570 may also include a dam material which encloses a region to be sealed, a filler material which fills a region enclosed by the dam material, and an opposing substrate which tightly seals the dam material and filler. In this case, it is preferred that the opposing substrate have flexibility. The sealing structured body 570 may also be a solid sealing material unit.

The FPC 320 is connected to the second wiring 555 exposed from the sealing structured body 570 via the bump 580 in the terminal region 106. It is possible to use an anisotropic conductive film instead of the bump 580. In addition to the FPC 320, a COG may also be connected to the second wiring 555 exposed from the sealing structured body 570.

Although a display device using the light emitting layer 560 in a pixel was exemplified in the present embodiment, it is also possible to use a liquid crystal layer instead of the light emitting layer 560. In the case where a liquid crystal layer is used in a pixel, it is possible to use a sealing member enclosing a region which seals the liquid crystal layer and an opposing substrate which seals the liquid crystal layer with the sealing member. A display device in which a liquid crystal layer is used in a pixel is explained in detail in the second embodiment.

[Material of Each Member]

A polyimide resin, an acrylic resin, an epoxy resin, a silicone resin, a fluororesin, a siloxane resin, or the like is used as the first resin layer 500 and the second resin layer 530. For example, in the case where the display device is a top emission type, the first resin layer 500 and the second resin layer 530 do not have to include translucency. Therefore, impurities may be introduced into the first resin layer 500 and the second resin layer 530 in order to improve resistance to a heat treatment in a formation process of a transistor. As a result, the translucency of the first resin layer 500 and the second resin layer 530 may be lowered. As is described later, the first resin layer 500 is made flexible (peeling of a glass substrate) by laser irradiation. The first resin layer 500 may be colored in order to increase absorptivity of the laser light used when making the first resin layer 500 flexible.

Aluminum (Al), titanium (Ti), chromium (Cr), cobalt (Co), nickel (Ni), zinc (Zn), molybdenum (Mo), indium (In), tin (Sn), hafnium (Hf), tantalum (Ta), tungsten (W), platinum (Pt), bismuth (Bi) and the like are used as the first wiring 520 and the second wiring 555. Copper (Cu), silver (Ag) and gold (Au), or the like may be used as the first wiring 520 in addition to the materials described above as long as diffusion into the transistor layer 550 can be suppressed. For example, in the case where translucency is required for the first wiring 520 as in a bottom emission type display device, a conductive oxide semiconductor such as ITO (indium tin oxide), IGO (indium oxide/gallium), IZO (indium zinc oxide) or GZO (zinc oxide doped with gallium as a dopant) can be used as the first wiring 520. The materials described above may also be stacked for use as the first wiring 520.

Silicon nitride ($SiN_x$), silicon nitride oxide ($SiN_xO_y$), silicon oxynitride ($SiO_xN_y$), silicon oxide ($SiO_x$), aluminum nitride ($AlN_x$), aluminum nitride oxide ($AlN_xO_y$), aluminum oxynitride ($AlO_xN_y$), aluminum oxide ($AlO_x$), and the like can be used as the first barrier layer 510 and the second barrier layer 540 (x and y are arbitrary positive numerical values). A structure in which these films are stacked may also be used as the first barrier layer 510 and the second barrier layer 540. The first barrier layer 510 and the second barrier layer 540 may be any material as long as they can suppress impurities, moisture, and oxygen from the exterior from reaching a semiconductor layer or the light emitting layer 560 of the transistor, and it is possible to use a TEOS layer or an organic insulation material in addition to the inorganic insulation materials described above. A structure in which an organic insulation material and an inorganic insulation material are stacked may be used as the first barrier layer 510 and the second barrier layer 540.

$SiO_xN_y$, and $AlO_xN_y$, are a silicon compound and an aluminum compound containing less nitrogen (N) than oxygen (O). $SiN_xO_y$, and $AlN_xO_y$, are a silicon compound and an aluminum compound containing less oxygen than nitrogen. A TEOS layer refers to a CVD layer using TEOS (Tetra Ethyl Ortho Silicate) as a raw material.

A transistor having various structures can be used as the transistor layer 550. For example, a top gate transistor structure in which a gate electrode is arranged above a semiconductor layer, or a bottom gate transistor structure in which a gate electrode is arranged below a semiconductor layer can be used as the transistor layer 550. Alternatively, a transistor structure in which a gate electrode and a semiconductor layer are stacked on a side wall of an insulation layer may be used as the transistor layer 550. In the transistor of each of the structures described above, an oxide semiconductor can be used as a material of the semiconductor layer in addition to a semiconductor such as silicon (Si) or silicon carbide (SiC).

A metal oxide having semiconductor characteristics can be used as the oxide semiconductor. For example, an oxide semiconductor containing indium (In), gallium (Ga), zinc (Zn), and oxygen (O) can be used as an oxide semiconductor. In particular, an oxide semiconductor having a composition ratio of In:Ga:Zn:O=1:1:1:4 can be used. However, the oxide semiconductor containing In, Ga, Zn and O used in the present invention is not limited to the composition described above. An oxide semiconductor having a different composition from that described above can be used as an oxide semiconductor containing In, Ga, Zn, and O. For example, an oxide semiconductor having a large ratio of In may be used for improving mobility with respect to the ratio described above. An oxide semiconductor having a high ratio of Ga with respect the ratio described above so as to increase a band gap in order to reduce the influence of light irradiation may also be used. In addition to IGZO described above, zinc oxide (ZnO), nickel oxide (NiO), tin oxide ($SnO_2$), titanium oxide ($TiO_2$), vanadium oxide ($VO_2$), indium oxide ($In_2O_3$) and strontium titanate ($SrTiO_3$) may also be used as an oxide semiconductor layer material.

It is possible to use semiconductors with various crystalline states for the transistors of each structure and the semiconductor layer of each material described above. For example, it is possible to use amorphous silicon, polycrystalline silicon, polycrystalline silicon, an amorphous oxide semiconductor, or a crystalline oxide semiconductor as a semiconductor layer of a transistor. In addition to the above, a silicon layer in which amorphous silicon and polycrystalline silicon are mixed, or an oxide semiconductor layer in which an amorphous oxide semiconductor and a crystalline oxide semiconductor are mixed can be used as the semiconductor layer of the transistor. A hybrid transistor in which a silicon transistor using the silicon layer descried above as a channel and an oxide semiconductor transistor using the oxide semiconductor described above as a channel are formed above the same substrate may be used as the transistor layer 550.

As described above, according to the display device 10 related to the first embodiment, by arranging the first wiring 520 connected to the second wiring 555 in a layer lower than the transistor layer 550, it is possible to connect one FPC 320 to both a drive circuit for driving a display panel and a touch detection drive circuit.

[Manufacturing Method of Display Device 10]

Figure 5:
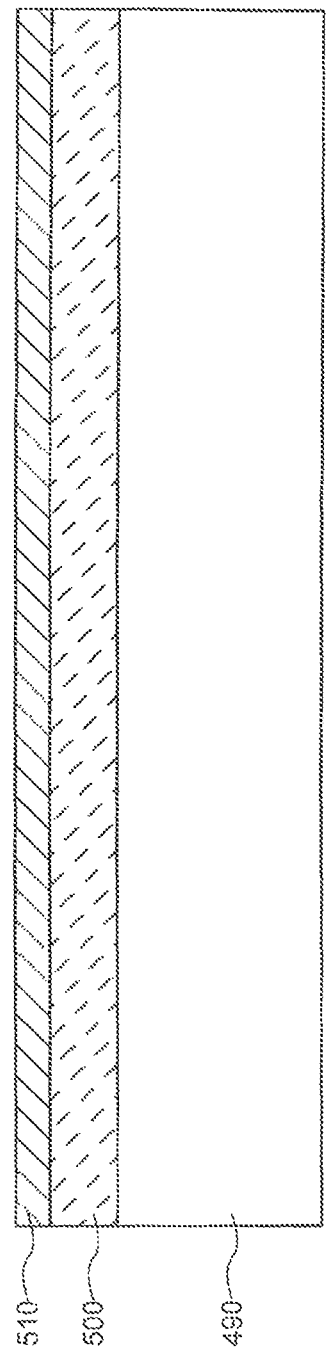
FIG. 5 is a cross-sectional diagram showing a process for forming a first resin layer and a first barrier layer above a glass substrate in a manufacturing method of a display device related to one embodiment of the present invention.

A method of manufacturing the display device 10 according to the first embodiment of the present invention is explained while referring to cross-sectional views using FIG. 5 to FIG. 11. The display device 10 is obtained by forming a structure including a display device above a glass substrate and then peeling off the glass substrate from the structure. FIG. 5 is a cross-sectional view showing a process for forming a first resin layer and a first barrier layer above a glass substrate in a method of manufacturing a display device according to one embodiment of the present invention. As is shown in FIG. 5, a first resin layer 500 is formed above a glass substrate 490. The first resin layer 500 is formed by a coating method. For example, a solution in which a resin material which becomes the first resin layer 500 is dissolved is applied while rotating the glass substrate 490, and the solution is volatilized by heat treatment, thereby the first resin layer 500 can be formed. In addition to the coating method described above, the first resin layer 500 can be formed by a coating method using a slit coater or a dipping method and the like.

A film thickness of the first resin layer 500 is required to be a film thickness so that the performance of the display device 10 can be retained after peeling the display device 10 from the glass substrate 490, that is, after providing flexibility. For example, the film thickness of the first resin layer 500 can be set to 1.0 μm or more. The film thickness of the first resin layer 500 is preferably 3.0 μm or more. Since the strength of the display device 10 is low in the case when the film thickness of the first resin layer 500 is thinner than the lower limit value, the performance of the display device 10 can not be maintained after providing flexibility.

After forming the first resin layer 500, the first barrier layer 510 is formed. The first barrier layer is formed by chemical vapor deposition (CVD). For example, $SiN_x$ is formed by a plasma CVD method. The film thickness of $SiN_x$ can be set to 20 nm or more and 1 μm or less. The film thickness of $SiN_x$ is preferably 50 nm or more and 500 nm or less. In addition to the plasma CVD method described above, a thermal CVD method, a plasma CVD method, a catalytic CVD method (Cat (Catalytic)—CVD method or a hot wire CVD method) or the like can be used as a method for forming the first barrier layer 510.

Figure 6:
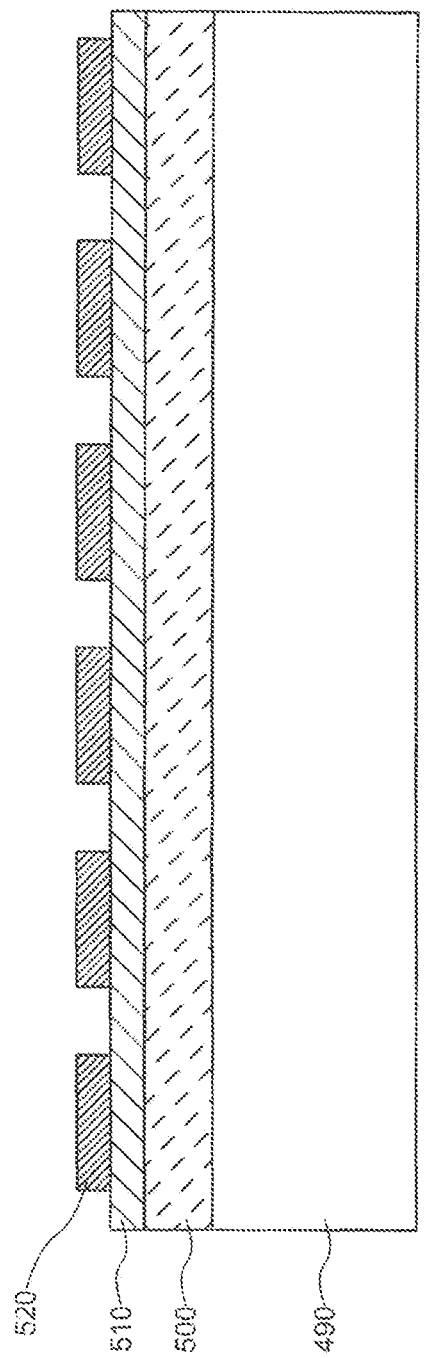
FIG. 6 is a cross-sectional diagram showing a process for forming a first wiring in a manufacturing method of a display device related to one embodiment of the present invention.

FIG. 6 is a cross-sectional diagram showing a process for forming a first wiring in the method of manufacturing a display device related to one embodiment of the present invention. As is shown in FIG. 6, a first wiring 520 is formed above the first barrier layer 510. The first wiring 520 is formed by physical vapor deposition (PVD). For example, Al and Ti are stacked using a sputtering method, and the stacked Al and Ti are patterned by photolithography and etching, thereby forming the first wiring 520 shown in FIG. 6. By forming Ti above Al, it is possible to suppress the Al surface from being naturally oxidized and insulated. The film thickness of Al can be set to 200 nm or more and 3.0 μm or less. The film thickness of Al is preferably 500 nm or more and 1.5 μm or less. The film thickness of Ti may be any thickness as long as it can suppress the oxidation of the Al surface, and it can be set to 50 nm or more and 200 nm or less, for example. Apart from the sputtering method described above, a vacuum evaporation method, an electron beam evaporation method, a plating method, a molecular beam and an epitaxy method or the like can be used as a method for forming Al and Ti.

Figure 7:
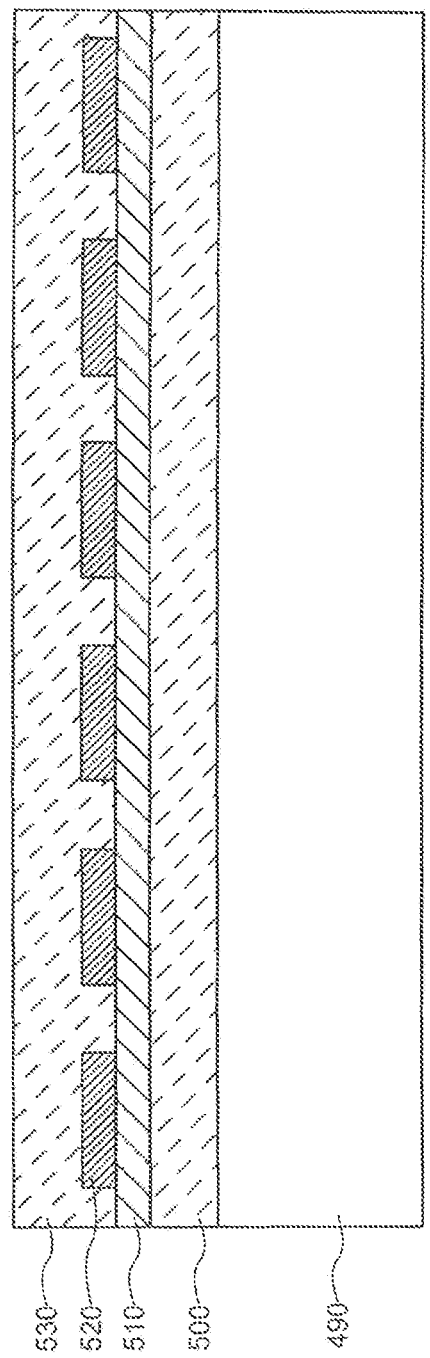
FIG. 7 is a cross-sectional diagram showing a process for forming a second resin layer in a manufacturing method of a display device related to one embodiment of the present invention.

FIG. 7 is a cross-sectional diagram showing a process for forming a second resin layer in the method of manufacturing a display device related to one embodiment of the present invention. The second resin layer 530 can be formed by a method similar to the method described in the explanation of the method for forming the first resin layer 500. In the method of manufacturing the display device 10, the method for forming the second resin layer 530 may be the same as or different from the method for forming the first resin layer 500. The second resin layer 530 is required to have a sufficient film thickness to relieve a step formed by the first wiring 520. For example, the film thickness of the second resin layer 530 can be formed thicker than the film thickness of the first wiring 520. That is, the film thickness of the second resin layer 530 in a region where the first wiring 520 is not formed (the region where the first barrier layer 510 is exposed from the first wiring 520) can be formed larger than the film thickness of the first wiring 520. The viscosity of the solution in which a resin material which becomes the second resin layer 530 is dissolved can be adjusted in order to reduce as much as possible the influence of a step of the first wiring 520 on the surface of the second resin layer 530 when forming the second resin layer 530. For example, the effect of leveling by the second resin layer 530 can be increased by lowering the viscosity of the solution for forming the second resin layer 530 compared to the solution for forming the first resin layer 500.

Figure 8:
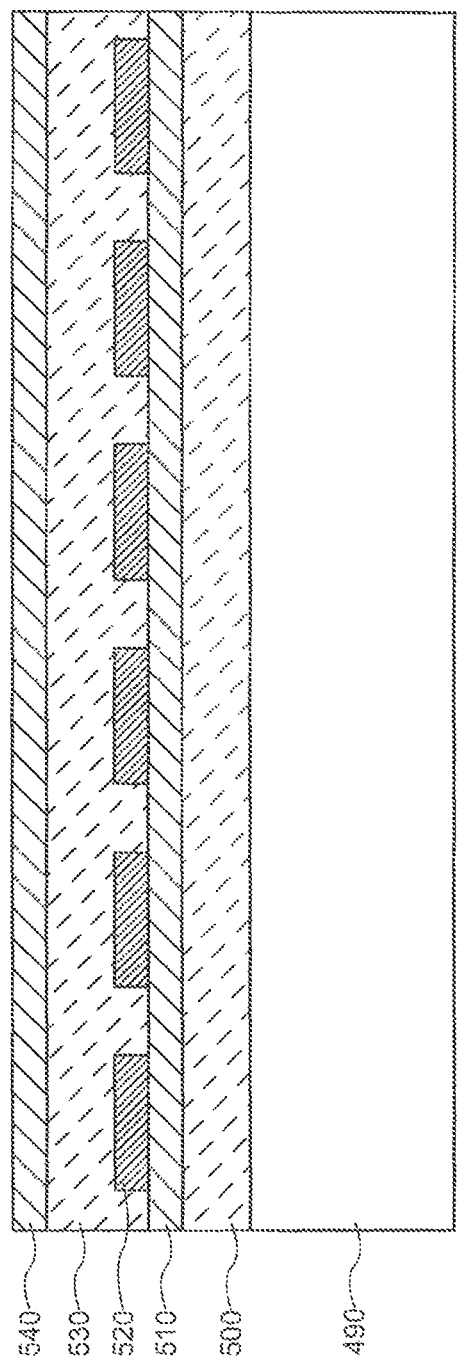
FIG. 8 is a cross-sectional diagram showing a process for forming a second barrier layer in a manufacturing method of a display device related to one embodiment of the present invention.

FIG. 8 is a cross-sectional diagram showing a process for forming a second barrier layer in the method of manufacturing a display device related to one embodiment of the present invention. The second barrier layer 540 can be formed by a method similar to the method described in the explanation of the method for forming the first barrier layer 510. In the method of manufacturing the display device 10, the method for forming the second barrier layer 540 may be the same as or different from the method for forming the first barrier layer 510.

Figure 9:
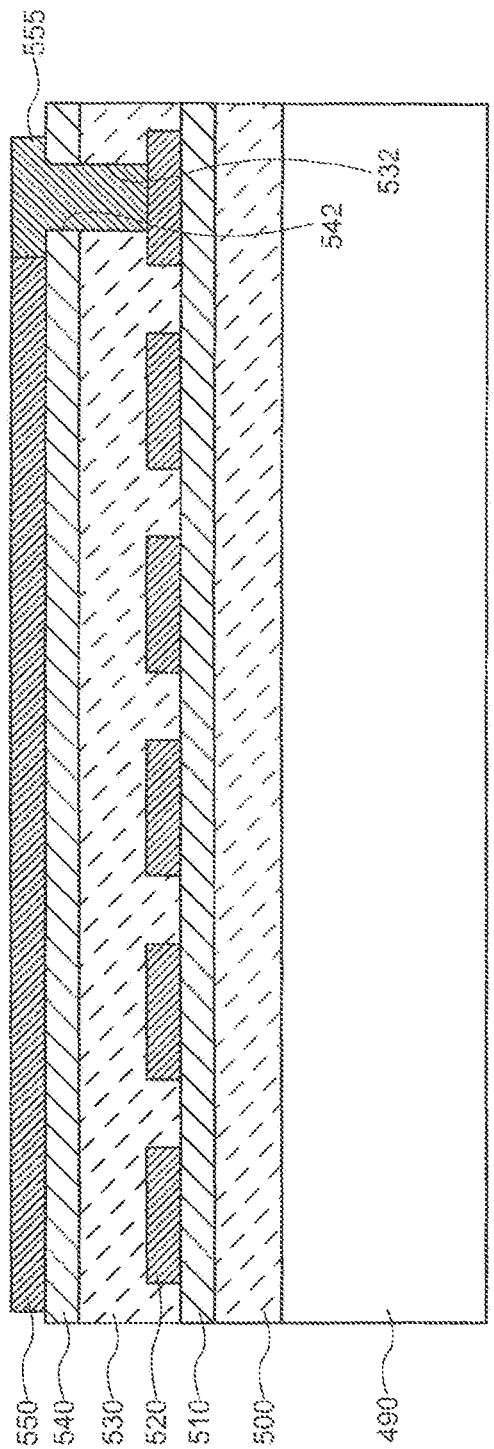
FIG. 9 is a cross-sectional diagram showing a process for forming a via hole in a second barrier layer and a second resin layer and for forming a transistor layer and a second wiring in a manufacturing method of a display device related to one embodiment of the present invention.

FIG. 9 is a cross-sectional diagram showing a process for forming a via hole in the second barrier layer and second resin layer and forming a transistor layer and a second wiring in the method of manufacturing a display device related to one embodiment of the present invention. As is shown in FIG. 9, a via hole 542 is formed in the second barrier layer 540 and the via hole 532 is formed in the second resin layer 530, thereby a part of the first wiring 520 is exposed. The via holes 542 and 532 are formed by photolithography and etching. The second barrier layer 540 and the second resin layer 530 may be collectively processed or may be processed in different processes.

The second wiring 555 and the transistor layer 550 are formed after the via holes 542 and 532 are formed. As described above, the second wiring 555 is formed by a part of or all of a conductive layer included in the transistor layer 550. In the case where the second wiring 555 is formed by stacking a plurality of conductive layers, an insulation layer may be arranged between the respective conductive layers. In the case where an insulation layer is arranged between the conductive layers, it is preferred that the conductive layers above and below the insulation layer conduct electricity via the via holes arranged in the insulation layer.

Figure 10:
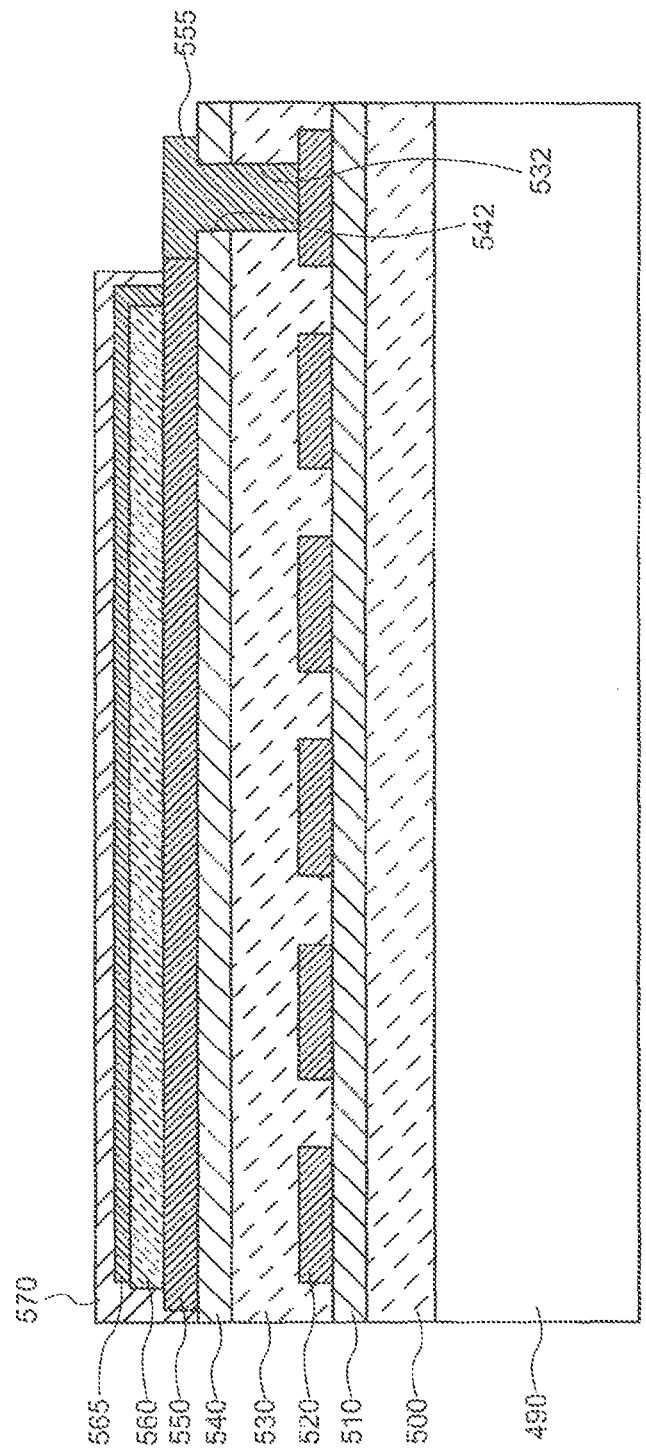
FIG. 10 is a cross-sectional diagram showing a process for forming a light emitting layer, a common electrode and a sealing structured body in a manufacturing method of a semiconductor device related to one embodiment of the present invention.

FIG. 10 is a cross-sectional diagram showing a process for forming a light emitting layer, a common electrode and a sealing structured body in a method of manufacturing a semiconductor device related to one embodiment of the present invention. As is shown in FIG. 10, the light emitting layer 560 and the common electrode 565 are formed above the transistor layer 550. A material corresponding to the light emission color of each pixel is formed for each pixel electrode of the transistor layer 550 as the light emitting layer 560. For example, a material which emits red light is used as the light emitting layer 560 for the R pixel. A material which emits green light is used as the light emitting layer 560 for the G pixel. A material which emits blue light is used as the light emitting layer 560 for the B pixel. The light emitting layer 560 may be formed by a vapor deposition method or a coating method. In the case where the light emitting layer 560 is formed by a vapor deposition method, vapor deposition is performed using a mask in which pixels to be vapor-deposited are opened. By performing such vapor deposition, it is possible to form a desired material in a desired pixel.

The common electrode 565 is formed after the light emitting layer 560 is formed as described above. The common electrode 565 can be formed by a vapor deposition method or a sputtering method. The common electrode 565 is also formed using a mask in which a region to be vapor-deposited or sputtered is opened similar to the light emitting layer 560.

The sealing structured body 570 is formed after the common electrode 565 is formed. The sealing structured body 570 covers the light emitting layer 560 and the common electrode 565. A part of the second wiring 555 is exposed from the sealing structured body 570. Specifically, a dam material (or a sealing material) is formed in a region corresponding to an outer edge part of the sealing structured body 570, a filler material is formed in a region surrounded by the dam material, and an opposing substrate and the dam material are adhered together to seal the filler material. In this way, the sealing structured body 570 can be formed. However, the sealing structured body 570 is not limited to the structure and formation method described above and various structures and formation methods can be used.

Figure 11:
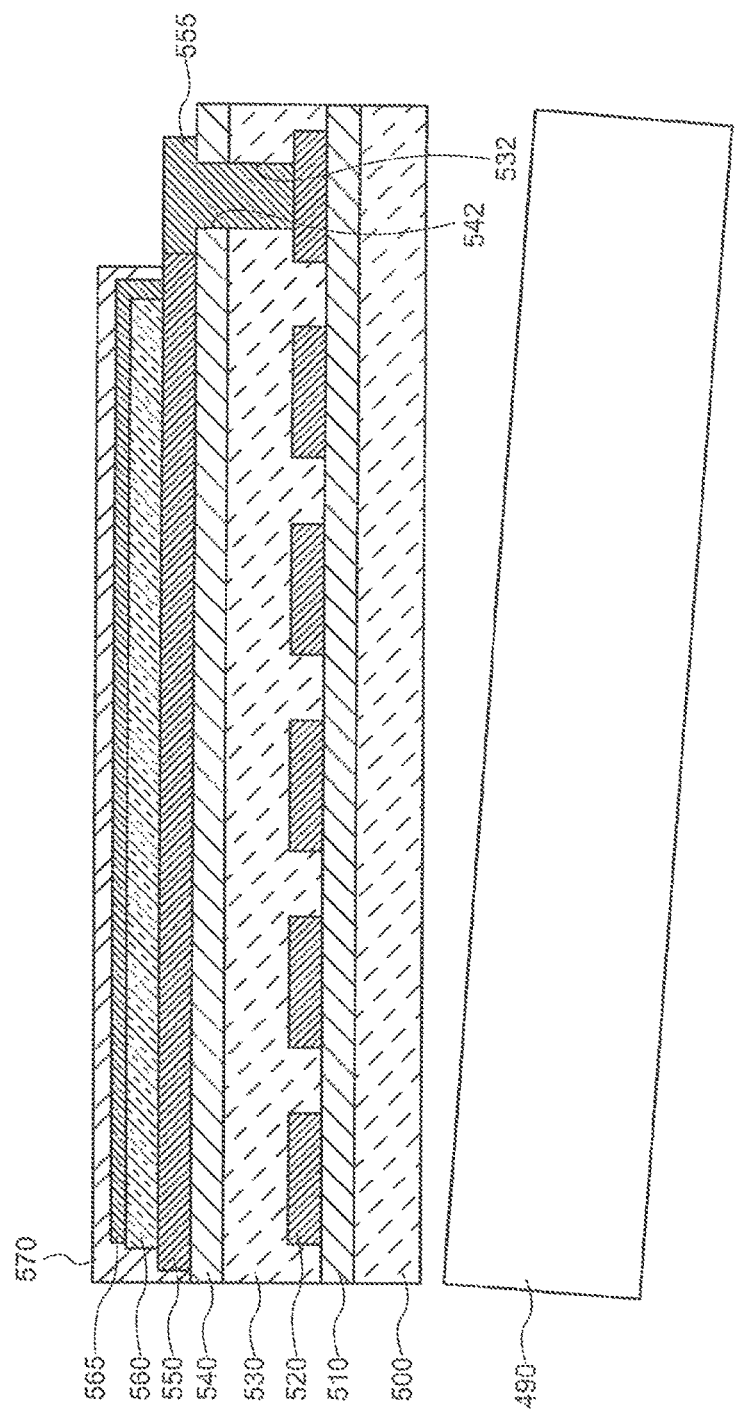
FIG. 11 is a cross-sectional diagram showing a process for peeling a glass substrate in a manufacturing method of a semiconductor device related to one embodiment of the present invention.

FIG. 11 is a cross-sectional diagram showing a process for peeling a glass substrate in the method of manufacturing a semiconductor device related to one embodiment of the present invention. As is shown in FIG. 11, a flexible display device 10 can be obtained by peeling the first resin layer 500 and the structured body formed there-above from the glass substrate 490. Peeling of the structured body including the first resin layer 500 is performed for example by laser irradiation from a rear surface (surface opposite to the surface on which the first resin layer 500 is formed) of the glass substrate 490, and locally heating the interface between the glass substrate 490 and the first resin layer 500.

The display device 10 shown in FIG. 4 is formed by forming a bump 580 on the second wiring 555 exposed from the sealing structured body 570 of the display device 10 shown in FIG. 11, and adhering the FPC 320 to the bump 580.

As described above, according to the method of manufacturing the display device 10 related to the first embodiment, since the first wiring 520 connected to the second wiring 555 can be formed in a layer lower than the transistor layer 550, it is possible to connect one FPC 320 to both the drive circuit for driving a display panel and a touch detection drive circuit.

Second Embodiment

An outline of a display device related to one embodiment of the present invention is explained using FIG. 12 to FIG. 16. In the second embodiment, a liquid crystal display device arranged with a touch sensor is explained. The embodiments illustrated below are merely embodiments of the present invention. The embodiments of the present invention can be applied to a semiconductor device. The semiconductor device excludes display devices which include a transistor arranged above a resin substrate having flexibility. For example, the structure described in one embodiment of the present invention can be applied in the case where it is necessary to connect a substrate formed with a transistor layer and wiring to a semiconductor device which is separate from this substrate. The embodiments of the present invention may also be applied to an integrated circuit (IC) such as a micro-processing unit (MPU). The embodiments of the present invention are not limited to a liquid crystal display device. For example, the embodiments of the present invention may also be applied to an organic EL display device.

Figure 12:
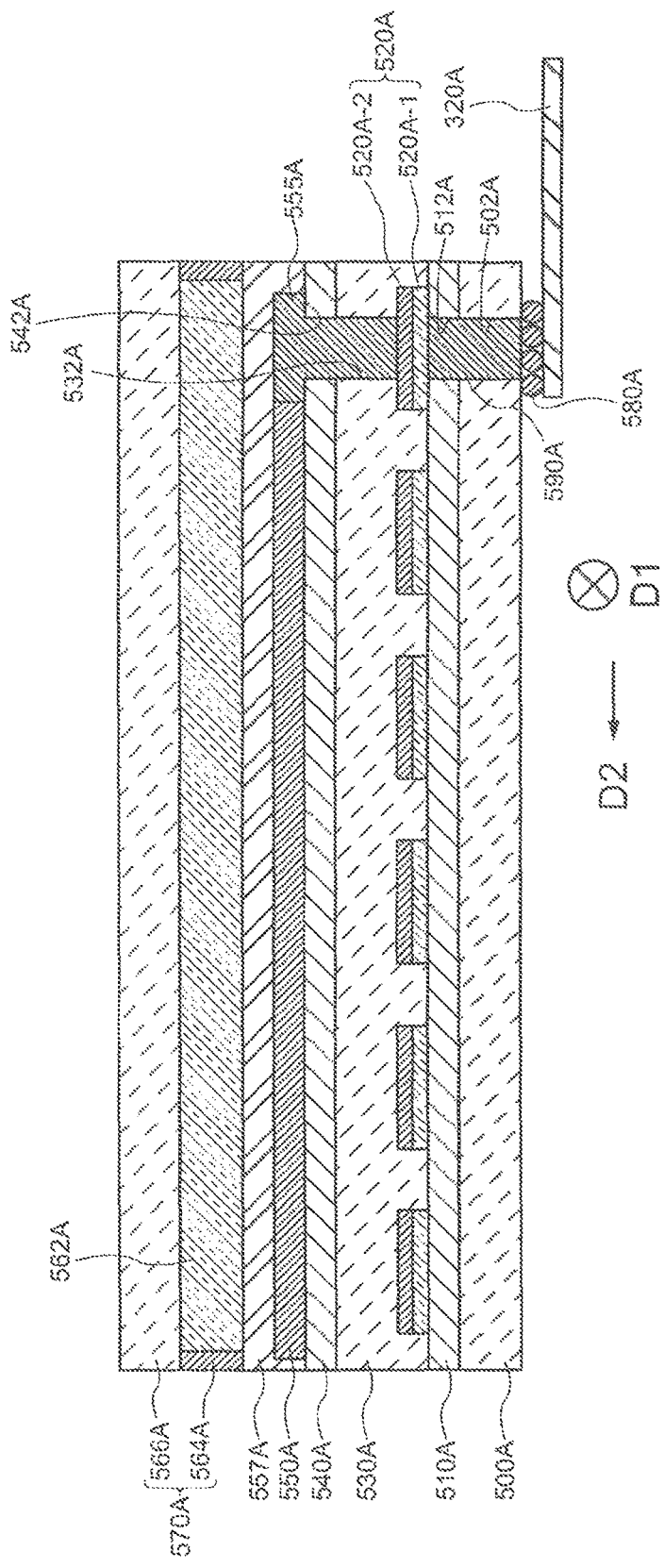
FIG. 12 is a cross-sectional diagram showing an outline of a display device related to one embodiment of the present invention.

Since the functional structure and layout of the display device 10A related to the second embodiment are the same as the display device 10 related to the first embodiment, an explanation is omitted here. Although the cross-sectional structure of the display device 10A shown in FIG. 12 is similar to the cross-sectional structure of the display device 10 shown in FIG. 4, the cross-sectional structure of the display device 10A is different to the cross-sectional structure of the display device 10 in the connection position of a FPC 320A, structure of first wiring 520A, connection structure between the first wiring 520A and FPC 320A and structure above a transistor layer 550A. These different points are explained below.

[Cross-Sectional Structure of Display Device 10A]

FIG. 12 is a cross-sectional diagram showing an outline of a display device related to one embodiment of the present invention. As is shown in FIG. 12, in the display device 10A, a via hole 502A is arranged in a first resin layer 500A and a via hole 512A is arranged in a first barrier layer 510A. A conductor 590A is arranged in the via holes 502A and 512A. A bump 580A is connected to the conductor 590A. A FPC 320A is connected to a first wiring 520A via the bump 580A and the conductor 590A. Although the structure in which the conductor 590A is filled into the via holes 502A and 512A is exemplified in FIG. 12, it is not necessary that the conductor 590A is filled into the via holes 502A and 512A. It is sufficient that the conductor 590A secures conduction between the FPC 320A and the first wiring 520A. In addition to the FPC 320A, a COG may be connected to the first wiring 520A via the conductor 590A.

When the structure described above is described in other words, it can be said that the display device 10A further includes the conductor 590A connected to the first wiring 520A, the first resin layer 500A has the via hole 502A, and the conductor 590A is in contact with the first wiring 520A via the via hole 502A. Furthermore, it can be said that the display device 10A has the FPC 320A connected to the first wiring 520A via the conductor 590A on the side opposite to the first wiring 520A of the first resin layer 500A.

As is shown in FIG. 12, the first wiring 520A has a stacked structure including a first conductive layer 520A-1 and second conductive layer 520A-2. Among this stacked structure, the first conductive layer 520A-1 on the side close to the first resin layer 500A is a transparent conductive film, and the second conductive layer 520A-2 on the side far from the first resin layer 500A is a metal film. ITO, IGO, IZO, GZO or the like can be used as the first conductive layer 520A-1. Al, Ti, Cr, Co, Ni, Zn, Mo, In, Sn, Hf, Ta, W, Pt, Bi, Cu, Ag, Au or the like can be used as the second conductive layer 520A-2. Since the first wiring 520A includes a transparent conductive film, the transparent conductive film can be used as an etching stopper when forming the via holes 502A and 512A in the first resin layer 500A and the first barrier layer 510A.

Although an example in which the first wiring 520A has a two-layer stacked structure is shown in FIG. 12, the first wiring 520A is not limited to a two-layer stacked structure. For example, the first wiring 520A may have a stacked structure of three or more layers or may have a single layer structure. Although the first wiring 520A includes a transparent conductive film in the above description, it is not necessary that the first wiring 520A include the transparent conductive film. In the case where the first wiring 520A has a single layer structure, the first wiring 520A may be a metal film or a transparent conductive film.

The display device 10A includes an interlayer insulation layer 557A, liquid crystal layer 562A, sealing material 564A and an opposing substrate 566A above the transistor layer 550A and the second wiring 555A. The interlayer insulation layer 557A is arranged between a pixel electrode of the transistor layer 550A and the liquid crystal layer 562A. An alignment film for controlling the alignment direction of liquid crystal molecules included in the liquid crystal layer 562A is arranged on the surface of the interlayer insulation layer 557A on the liquid crystal layer 562A side. The interlayer insulation layer 557A is arranged at a position overlapping a FPC 320A in a plan view. Similarly, the liquid crystal layer 562A is arranged at a position overlapping the FPC 320A in a plan view.

The sealing material 564A is arranged around the liquid crystal layer 562A above the interlayer insulation layer 557A. That is, the sealing material 564A continuously surrounds the liquid crystal layer 562A without any gaps. The opposing substrate 566A is adhered to the interlayer insulation layer 557A by the sealing material 564A. In other words, the sealing material 564A and the opposing substrate 566A seal the liquid crystal layer 562A. That is, the sealing material 564A and the opposing substrate 566A can be collectively referred to as the sealing structured body 570A. The opposing substrate 566A and the sealing material 564A are arranged at positions overlapping the FPC 320A in a plan view.

As described above, according to the display device 10A related to the second embodiment, the FPC 320A is arranged on a side opposite to the side on which the transistor layer 550A is arranged with respect to the first resin layer 500A. That is, it is not necessary to arrange a region for adhering the FPC 320A on the side where the transistor layer 550A is arranged with respect to the first resin layer 500A. Specifically, it is not necessary to expose the surface of the second wiring 555A in order to adhere the FPC 320A. Therefore, the liquid crystal layer 562A and the sealing material 564A can be arranged at a position overlapping the FPC 320A in a plan view. With this structure, the upper surface side of the transistor layer 550A can be efficiently used as a display region. As a result, it is possible to realize a display device with a narrow bezel.

[Manufacturing Method of Display Device 10A]

A method of manufacturing the display device 10A related to the second embodiment of the present invention is explained while referring to cross-sectional diagrams using FIG. 13 to FIG. 16. Similar to the display device 10 related to the first embodiment, the display device 10A is obtained by forming a structure including a display device above a glass substrate and then peeling the glass substrate from the structure. In the manufacturing method of the display device 10A, since the manufacturing method of the display device 10 shown in FIG. 5 to FIG. 9 is also common to the display device 10A, an explanation is omitted.

Figure 13:
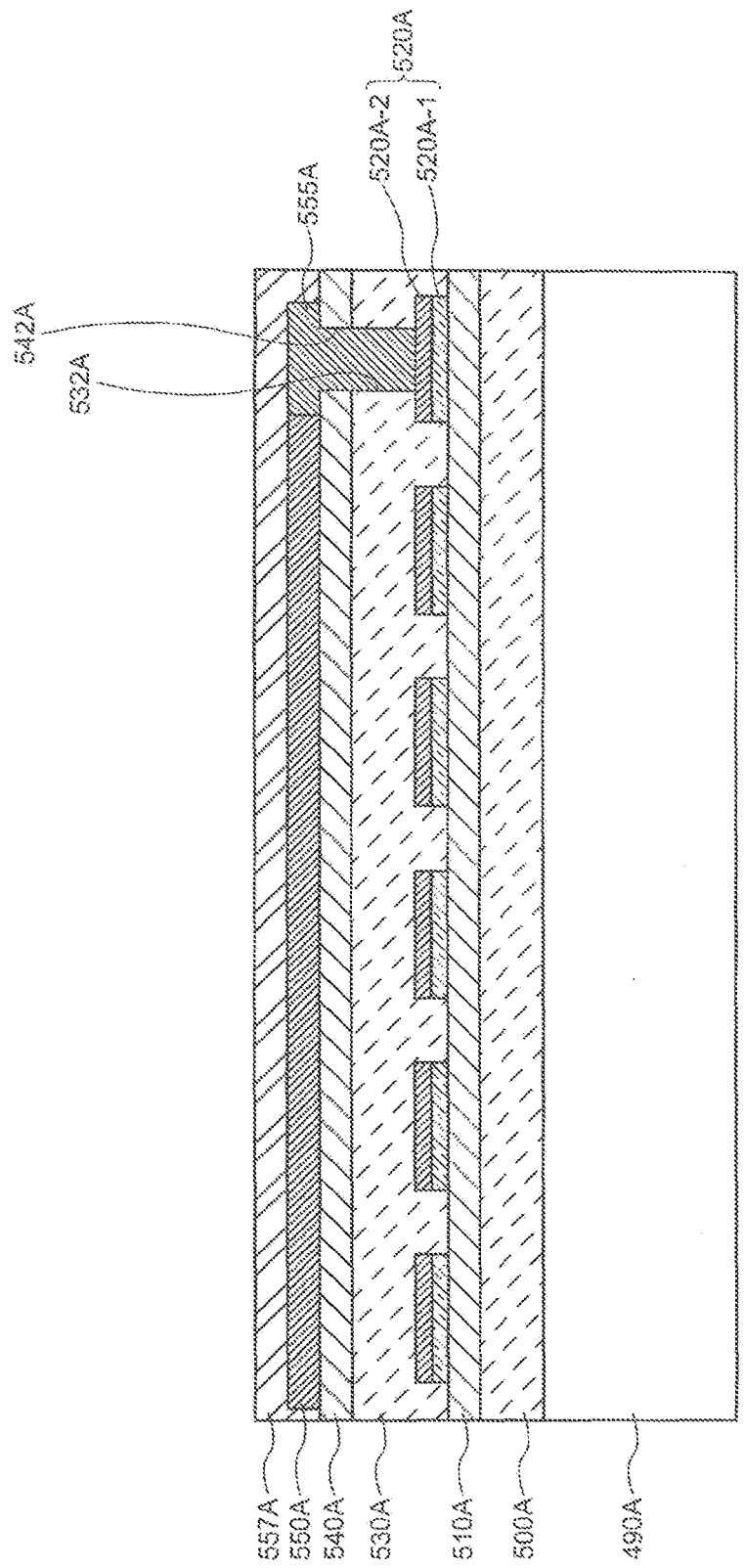
FIG. 13 is a cross-sectional diagram showing a process for forming an interlayer film above a transistor layer and second wiring in a manufacturing method of a semiconductor device related to one embodiment of the present invention.

FIG. 13 is a cross-sectional diagram showing a process for forming an interlayer film above a transistor layer and a second wiring in a method of manufacturing a semiconductor device related to one embodiment of the present invention. As is shown in FIG. 13, an interlayer insulation layer 557A is formed above the transistor layer 550A and the second wiring 555A. After forming the interlayer insulation layer 557A, a rubbing treatment is performed on the surface of the interlayer insulation layer 557A. For example, the rubbing treatment is performed by rubbing the surface of the interlayer insulation layer 557A in a fixed direction using a cloth or the like.

Figure 14:
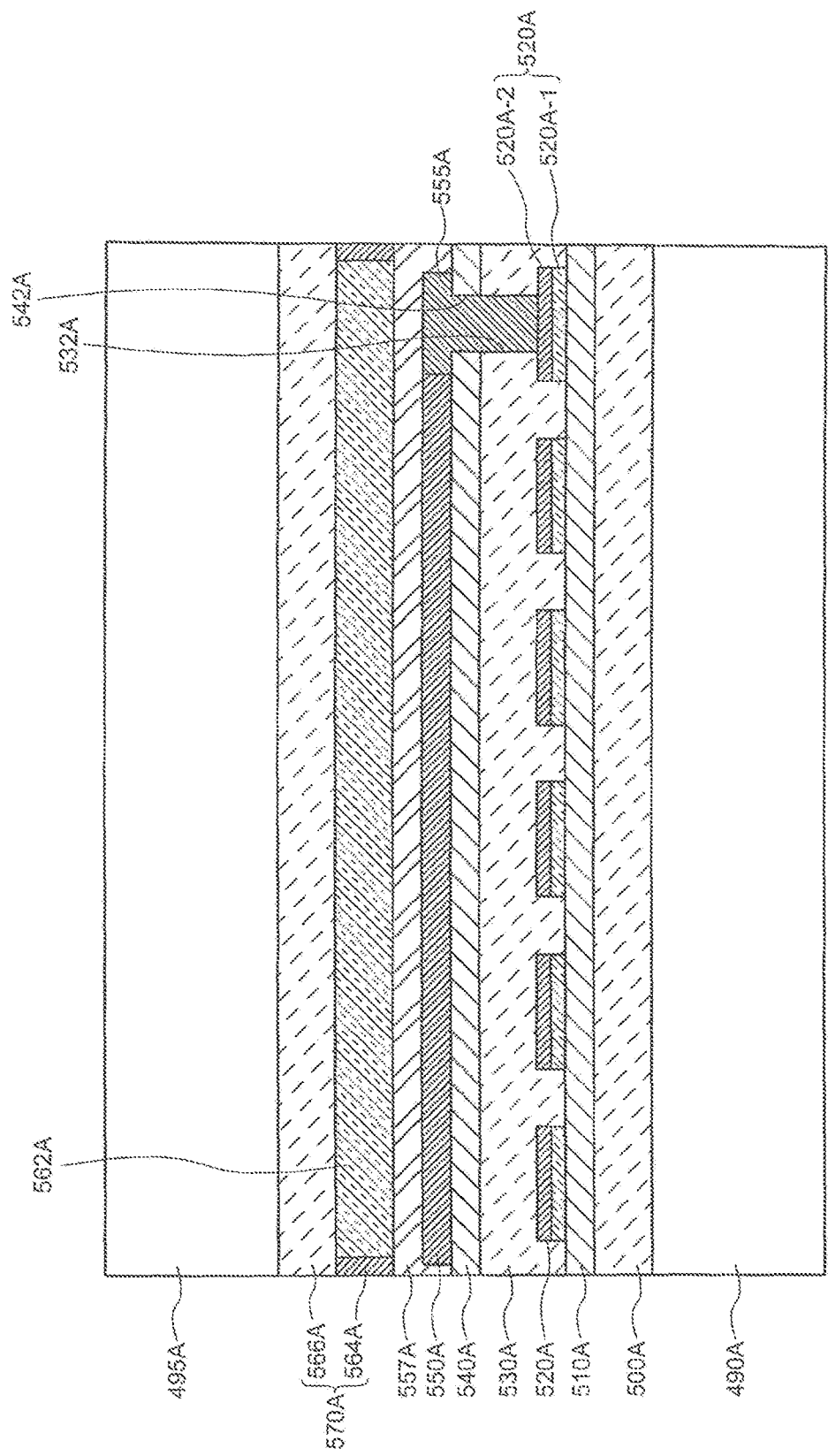
FIG. 14 is a cross-sectional diagram showing a process for forming a liquid crystal layer and an opposing electrode in a manufacturing method of a semiconductor device related to one embodiment of the present invention.

FIG. 14 is a cross-sectional diagram showing a process for forming a liquid crystal layer and an opposing substrate in the method of manufacturing a semiconductor device related to one embodiment of the present invention. Before forming a liquid crystal layer 562A, an opposing glass substrate 495A is prepared separately from the glass substrate 490A, and a resin opposing substrate 566A is formed above the opposing glass substrate 495A. As is shown in FIG. 14, a sealing material 564A is formed on the surface side periphery part of the interlayer insulation layer 557A, and the glass substrate 490A and the opposing glass substrate 495A are bonded together using the sealing material 564A. By this bonding, a space sealed by the interlayer insulation layer 557A, the sealing material 564A and the opposing substrate 566A is formed. The sealed space is filled with the liquid crystal layer 562A. Although a structure in which the sealing material 564A is formed at the outer periphery end part of the interlayer insulation layer 557A is shown in FIG. 14, the sealing material 564A may also be formed inside with an offset arranged from the outer periphery end part of the interlayer insulation layer 557A. In this case, the liquid crystal layer 562A is formed only in a region surrounded by the sealing material 564A.

Figure 15:
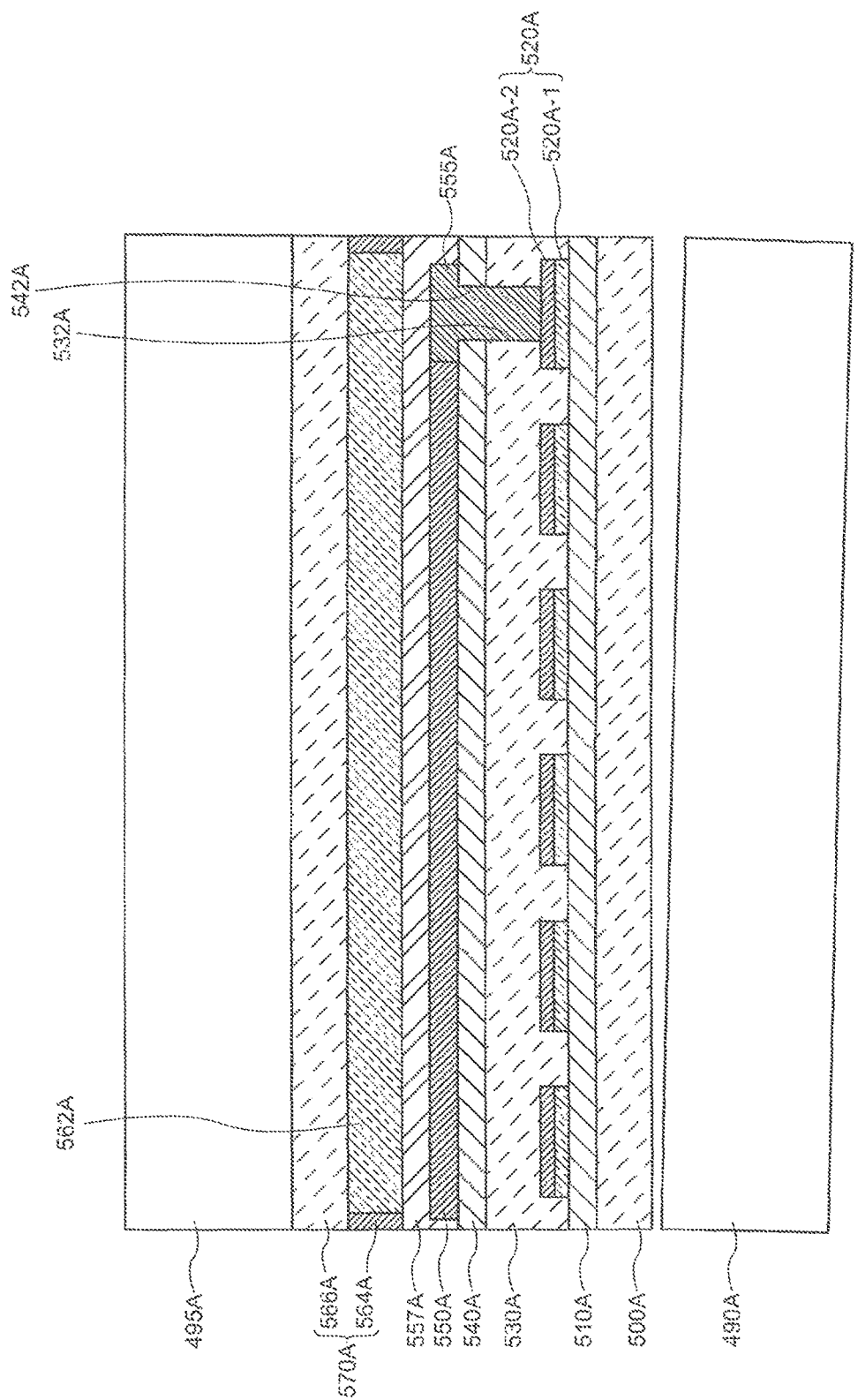
FIG. 15 is a cross-sectional diagram showing a process for peeling a glass substrate in a manufacturing method of a semiconductor device related to one embodiment of the present invention.

FIG. 15 is a cross-sectional diagram showing a process for peeling a glass substrate in the method of manufacturing the semiconductor device related to one embodiment of the present invention. As is shown in FIG. 15, the glass substrate 490A is peeled from the structure between the first resin layer 500A and the opposing substrate 566A the same as the method explained in FIG. 11. The glass substrate 490A is peeled off by laser irradiation from the rear side of the glass substrate 490A. As is described herein, the opposing glass substrate 495A is peeled off after dry etching is performed for forming the via holes 502A and 512A.

Figure 16:
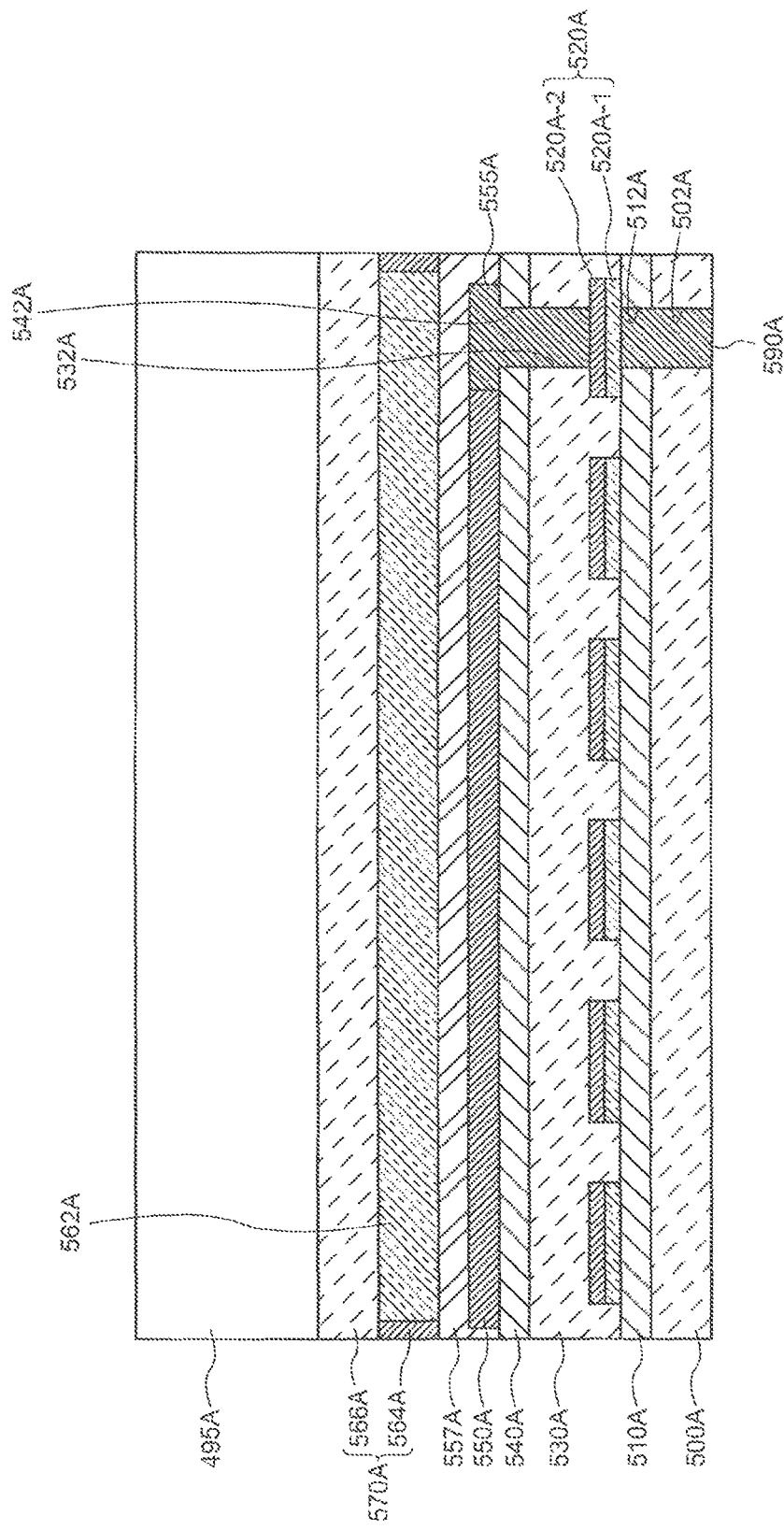
FIG. 16 is a cross-sectional diagram showing a process for forming a via hole in a first resin layer and a first barrier layer and for forming a conductor in a via hole in a manufacturing method of a semiconductor device related to one embodiment of the present invention.

FIG. 16 is a cross-sectional diagram showing a process for forming a via hole in a first resin layer and a first barrier layer and forming a conductor in the via hole in the method of manufacturing the semiconductor device related to one embodiment of the present invention. As is shown in FIG. 16, a via hole 502A is formed in a first resin layer 500A and a via hole 512A is formed in a first barrier layer 510A so that a part of a first wiring 520A is exposed. The via holes 502A and 512A are processed by dry etching. The dry etching is stopped by a second conductive layer 520A-1 (transparent conductive film) included in the first wiring 520A. That is, the second conductive layer 520A-1 functions as an etching stopper to processing (dry etching) of the via holes 502A and 512A.

A conductor 590A connected to the first wiring 520A is formed in the via holes 502A and 512A. For example, the conductor 590A is formed by a PVD method similar to the formation of the first wiring 520A. In addition to the PVD method described above, the conductor 590A may also be formed by a paste and firing of a conductive material, soldering, an anisotropic conductive film (ACF), or conductive beads.

Figure 17:
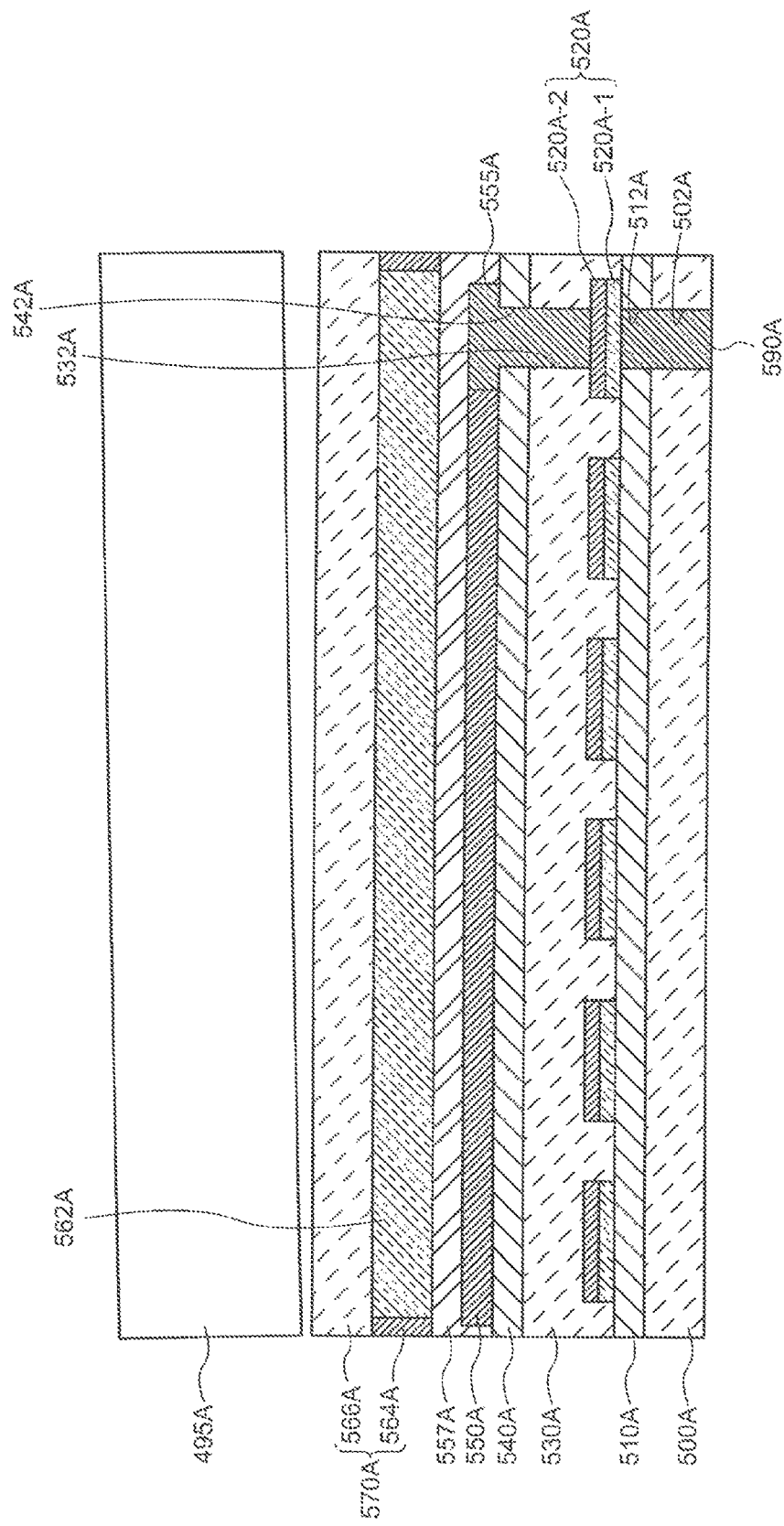
FIG. 17 is a cross-sectional diagram showing a process for peeling an opposing glass substrate in a manufacturing method of a semiconductor device related to one embodiment of the present invention.

FIG. 17 is a cross-sectional diagram showing a process for peeling an opposing glass substrate in the method of manufacturing the semiconductor device related to one embodiment of the present invention. As is shown in FIG. 17, the opposing glass substrate 495A is peeled from the structure between the first resin layer 500A and the opposing substrate 566A the same as the method explained in FIG. 11. The opposing glass substrate 495A is peeled off by laser irradiation from the rear surface side of the opposite glass substrate 495A (the surface opposite to the surface on which the opposing substrate 566A is formed).

In the present embodiment, a manufacturing method for processing via holes 502A and 512A by dry etching was explained so that the opposing glass substrate 495A is peeled off after formation of the via holes 502A and 512A. However, in the case where the via holes 502A and 512A are processed by laser light such as in laser processing, the opposing glass substrate 495A may be peeled off before processing of the via holes 502A and 512A.

A bump 580A is formed on the conductor 590A connected to the first wiring 520A of the display device 10A shown in FIG. 17 and the FPC 320A is adhered to the bump 580A, thereby the display device 10A shown in FIG. 12 is formed.

As is described above, according to the method for manufacturing the display device 10A related to the second embodiment, it is possible to form the FPC 320A on the side opposite to the side on which the transistor layer 550A is arranged with respect to the first resin layer 500A. That is, it is not necessary to arrange a region for adhering the FPC 320A on the side where the transistor layer 550A is arranged with respect to the first resin layer 500A. Specifically, it is not necessary to expose the surface of the second wiring 555A in order to adhere the FPC 320A. Therefore, it is possible to form the liquid crystal layer 562A and the sealing material 564A at positions overlapping the FPC 320A in a plan view. With this structure, the upper surface side of the transistor layer 550A can be efficiently used as a display region. As a result, it is possible to realize a display device with a narrow bezel.

Furthermore, the present invention is not limited to any of the embodiments described above, and may be appropriately altered without departing from the gist of the present invention.

What is claimed is:

1. A semiconductor device comprising:
   a first resin layer;
   one or more first wirings above the first resin layer;
   a second resin layer above the first wiring, the second resin layer including a first opening part;
   a transistor above the second resin layer, the transistor including a semiconductor layer, a gate insulation layer, and a gate electrode layer; and
   a second wiring above the second resin layer, the second wiring being connected to the transistor and connected to the first wiring via the first opening part.

2. The semiconductor device according to claim 1, further comprising:
   a first barrier layer between the first resin layer and the first wiring.

3. The semiconductor device according to claim 2, further comprising:
   a second barrier layer between the second resin layer and the transistor, the second barrier layer having a second opening part;

wherein
the second wiring is connected to the first wiring via the first opening part and the second opening part.

4. The semiconductor device according to claim 1, wherein the first wiring includes a plurality of first sensor wirings for detecting an input operation from the exterior.

5. The semiconductor device according to claim 4, wherein the plurality of first sensor wirings can be alternately and independently controlled.

6. The semiconductor device according to claim 5, further comprising:
 a second sensor wiring connected to the second wiring, the second sensor wiring forming a capacitance with the first sensor wiring;
 wherein
 the plurality of first sensor wirings have a long side in a first direction and the plurality of second sensor wirings have a long side in a second direction intersecting the first direction.

7. The semiconductor device according to claim 1, further comprising:
 a conductor connected to the first wiring;
 wherein
 the first resin layer includes a third opening part, and
 the conductor contacts the first wiring via the third opening part.

8. The semiconductor device according to claim 7, further comprising:
 a FPC connected to the first wiring via the conductor at an opposite side of the first wiring with respect to the first resin layer.

9. The semiconductor device according to claim 7, wherein the first wiring includes a transparent conductive film.

10. The semiconductor device according to claim 7, wherein the first wiring is a stacked layer structure including a metal film and a transparent conductive film, and the transparent conductive film is closer to the first resin layer than the metal film.

* * * * *